(12) United States Patent
Hochwald et al.

(10) Patent No.: US 7,236,536 B2
(45) Date of Patent: Jun. 26, 2007

(54) METHOD AND APPARATUS FOR DETECTION AND DECODING OF SIGNALS RECEIVED FROM A LINEAR PROPAGATION CHANNEL

(75) Inventors: Bertrand Martyn Hochwald, Summit, NJ (US); Stephan Ten Brink, Holmdel, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 880 days.

(21) Appl. No.: 10/205,706

(22) Filed: Jul. 26, 2002

(65) Prior Publication Data

US 2003/0076890 A1 Apr. 24, 2003

Related U.S. Application Data

(60) Provisional application No. 60/308,046, filed on Jul. 26, 2001.

(51) Int. Cl.
*H04L 5/12* (2006.01)
*H04L 27/06* (2006.01)
*H03M 13/03* (2006.01)

(52) U.S. Cl. ............... 375/265; 375/340; 714/794

(58) Field of Classification Search ............ 375/242, 375/261, 262, 265, 340–341; 714/792, 794, 714/795
See application file for complete search history.

(56) References Cited

U.S. PATENT DOCUMENTS 6,611,513 B1 *   8/2003   ten Brink ............ 370/342
6,629,287 B1 *   9/2003   Brink ................. 714/755
6,662,337 B1 *  12/2003   Brink ................. 714/792
6,756,872 B2 *   6/2004   Penther ............... 335/229
6,795,507 B1 *   9/2004   Xin et al. ............ 375/265
6,856,656 B2 *   2/2005   Eidson et al. ........ 375/326
6,891,897 B1 *   5/2005   Bevan et al. ......... 375/265
7,010,064 B2 *   3/2006   Penther ............... 375/340
2003/0007577 A1 *  1/2003   Shiu et al. .......... 375/341
2003/0103584 A1 *  6/2003   Bjerke et al. ........ 375/340

FOREIGN PATENT DOCUMENTS

EP        1 085 661 A1 *  3/2001

* cited by examiner

*Primary Examiner*—Young T. Tse

(57) ABSTRACT

Techniques for transmitting and receiving signals using a linear propagation channel, and the detection and decoding of the signals, are described. The symbols are decoded by computing the likelihood of each bit in a block of data in light of all blocks of received complex data and the constraints imposed by the channel code. Extrinsic information and a priori information are exchanged in an iterative fashion until desired performance is achieved. Extrinsic probability values are computed by searching through hypotheses in the constellation of available symbols to maximize the extrinsic probability values, with decoding employing a stored list of candidate points for discovered within a search radius, the list comprising the solution points found within the smallest radii.

20 Claims, 11 Drawing Sheets

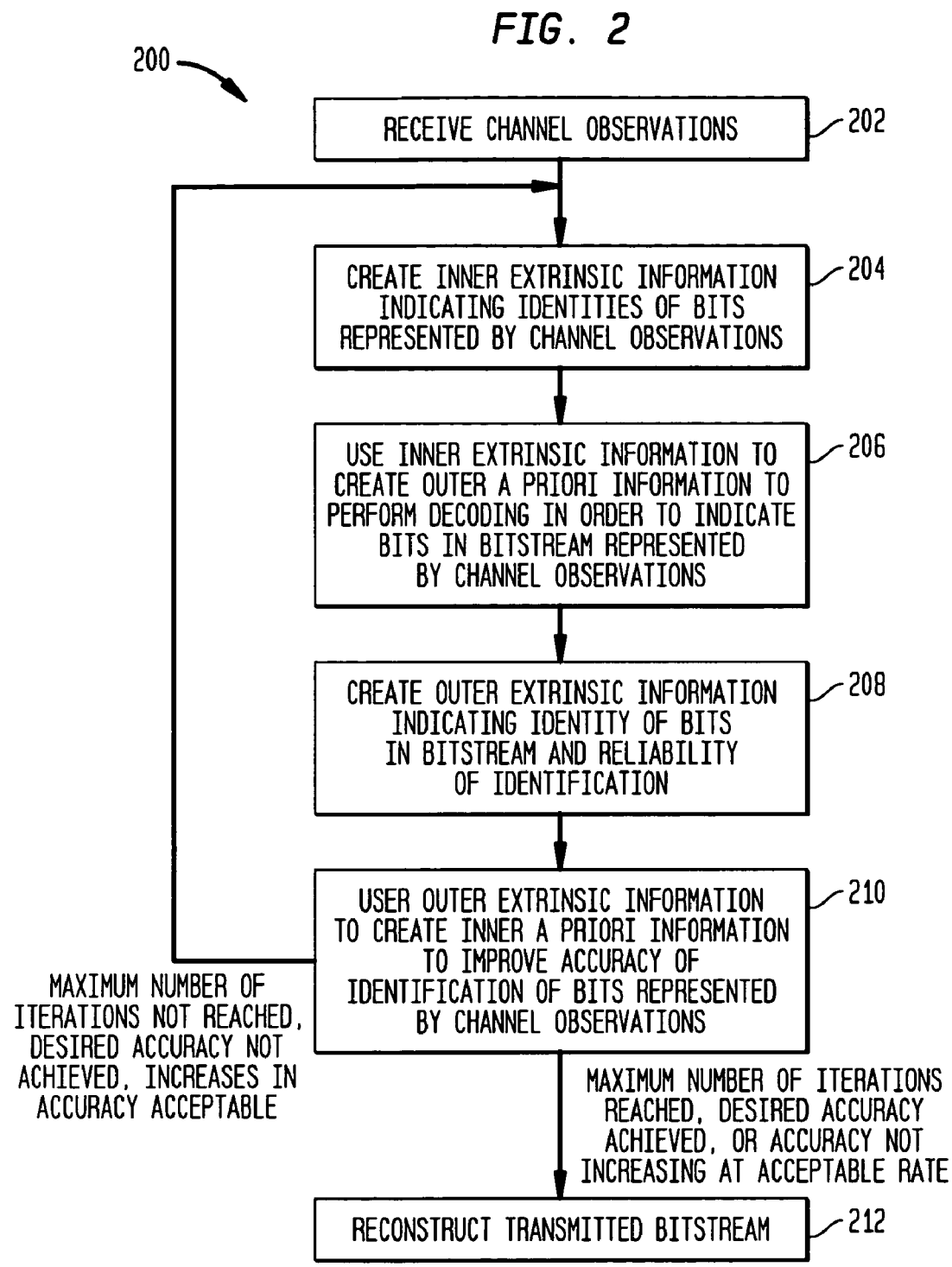

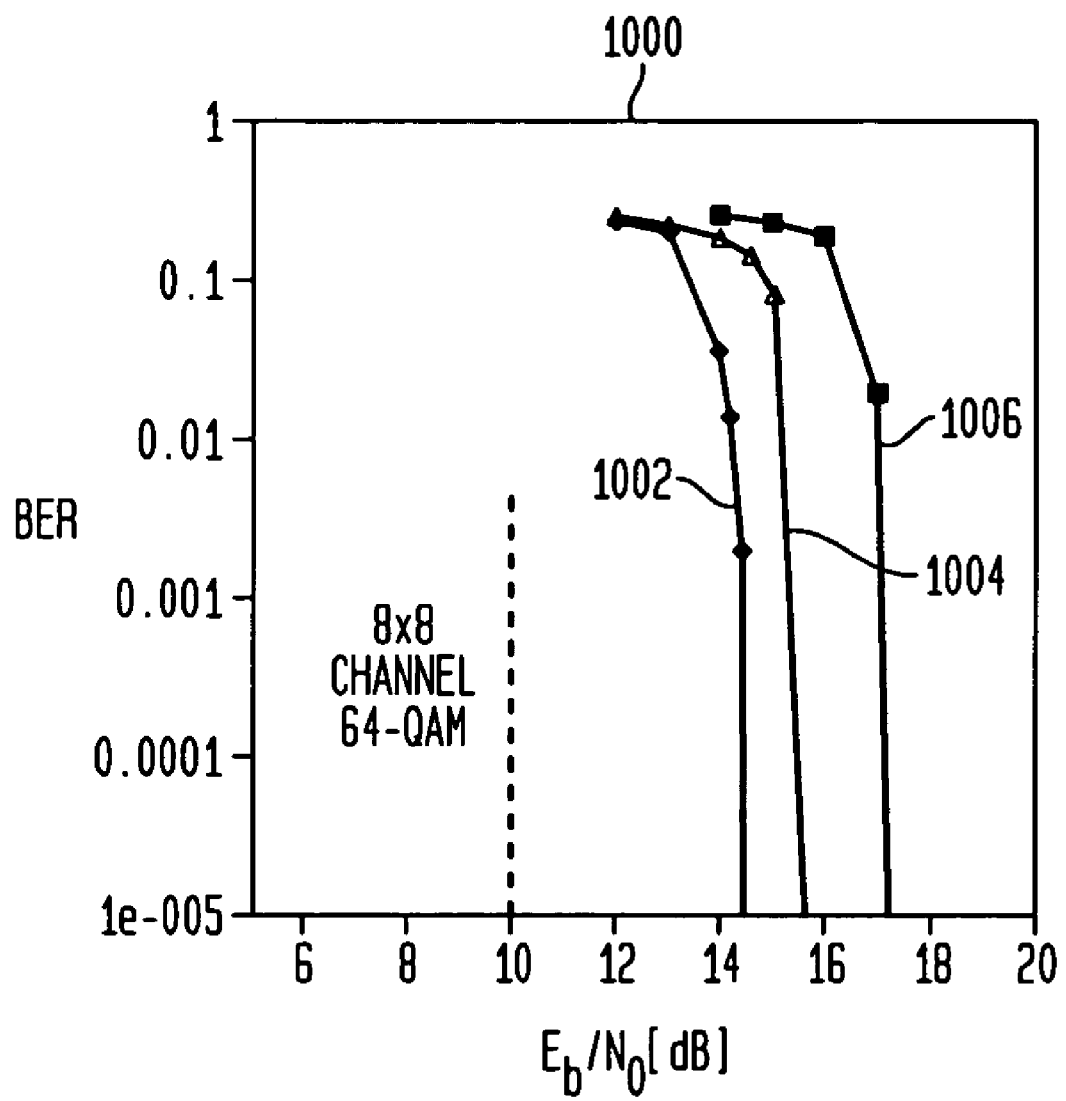

METHOD AND APPARATUS FOR DETECTION AND DECODING OF SIGNALS RECEIVED FROM A LINEAR PROPAGATION CHANNEL

This application claims the benefit of U.S. Provisional Application Ser. No. 60/308,046 filed Jul. 26, 2001 and incorporated by reference herein in its entirety.

FIELD OF THE INVENTION

The present invention relates generally to wireless telephony. More particularly, the invention relates to improvements in encoding and decoding systems that can be used to achieve near channel capacity transmission rates using multiple transmission and receiving antennas.

BACKGROUND OF THE INVENTION

Wireless communication, and indeed nearly all communication, has as a significant goal the maximization of the information that can be transmitted over a particular communication channel. Maximization of information transfer is of particular interest in wireless communication channels in part because wireless channels are subject to constraints and difficulties that are less prevalent with wired channels.

In wireless and other communication channels, information is typically transmitted from a transmitter to a receiver in the form of signals transmitted over a wireless channel. In order to increase the amount of information that can be transmitted over a channel, as well as to provide for error correction, information is transmitted not in the form of bits, but instead in the form of symbols representing bits. In one common system of encoding, a bit stream is encoded using a channel code that adds redundancy and error correction, and the encoded bit stream is mapped to a sequence of complex-valued symbols selected from a constellation, which are transmitted as modulations of a carrier wave. At the receiver, the symbols must be detected and decoded in order to identify the symbols being received and to determine the information content being received. The encoded bit stream must be reconstituted from the symbols and the original bit stream must be recovered from the encoded bit stream. The choice of encoding and decoding techniques is dependent on a number of factors, including the need to transmit information efficiently, the need to detect and correct errors and the need to maximize computational efficiency in encoding and, in particular, in decoding the symbols.

One particularly advantageous way to achieve high data transfer rates on a scattering-rich wireless channel is to use multiple transmit and receive antennas. Many of the practical space-time methods that achieve high data transfer rates are designed to use simple symbol detection at the receiver because they map the symbols linearly to the transmit antennas. Different coding techniques employ different performance criteria. For example, an encoding technique may be designed to optimize a raw block or bit pairwise error performance criterion, while another technique may be designed to optimize an information-theoretic criterion.

Whichever technique is used, any technique designed to achieve capacity on a channel will typically require some form of "outer" channel code that provides redundancy, and interleavers to guard against bursty fading, interference and additive receiver noise. In such a case, a space-time encoder used to encode the information content of the symbols to be transmitted will construct an "inner" code that encodes the symbols. An "outer" code will introduce redundancy, and the transmitted symbols will represent the redundancy encoding as well as the information content. A space-time detector at the receiver will be required to detect and decode symbols that are correlated through the channel code, thus significantly complicating the detection process. That is, the space-time detector will be required to determine the information content of the symbols received through the channel, taking into account the fact that the symbols include outer coding to add redundancy and error correction as well as inner coding representing the information content.

The space-time encoding and the channel encoding can be combined. An example of an encoding system employing the combination of space-time encoding and channel encoding are trellis codes. However, these combined codes are typically designed by hand and have state complexity that increases exponentially with the number of antennas used. This rapid increase in complexity greatly increases computational requirements imposed by the use of such codes in a multiple antenna environment.

There exists, therefore, a need for encoding and decoding techniques that will operate suitably for increasing numbers of transmit and receive antennas, and at the high transmission capacities achievable by these antennas on a flat-fading channel.

SUMMARY OF THE INVENTION

A wireless transmitter and receiver according to an aspect of the present invention suitably employ multiple transmit and receive antennas for transmission of information encoded as symbols over a wireless channel. The symbols represent an original bitstream that has been subjected to outer encoding to introduce redundancy and error correction and inner coding in order to create an encoded bitstream, with the information content having been encoded into the symbols. The symbols are members of a constellation of available symbols. The symbols are decoded by examining blocks of data and, for each bit in the block of data, computing the likelihood that the bit is a one or a zero. This computation is performed while taking into account all blocks of received complex data, the constraints imposed by the channel code and likelihood information relating to which symbols are likely to have been received.

Reliability information provided by a channel decoder and soft information provided by a multiple-input multiple-output (MIMO) detector are exchanged in an iterative fashion until a desired level of accuracy is achieved. Preferably, soft information is quantized in terms of more than one bit in a manner known in the art. For example, a detector expressing soft information to identify detected symbols produces information indicating the identity of the symbol accompanied by an indicator of the reliability of the indication of the symbol identity. Over a number of iterations, the outputs of the detector and the decoder employed in a system according to the present invention converge more and more closely to the identified states.

The detector computes extrinsic probability values, that is, values indicating the probability that a detected signal represents a particular symbol, and searches through the constellation of the available symbols to select symbols that maximize the extrinsic probability values. That is, the detector searches for symbols having a high probability of corresponding to the detected signal. The detector employs a modified process of complex or list sphere decoding or a process combining complex and list sphere decoding to conduct an efficient search by minimizing the number of candidates to be examined in the search, with a list being constructed comprising a predetermined number of $N_{cand}$ candidate points. The candidate points in the list are the $N_{cand}$ candidate points having the smallest search radius. At first, a search is made to find $N_{cand}$ candidate points. The list is further refined by continuing the search. When a new point is found having a radius smaller than that of the largest radius of those on the list, the point with the largest radius is discarded in favor of that with the smaller radius. Once the list is constructed, it can be used to provide information about any given bit. If the list contains many entries wherein a specified bit has a value of 1, it is likely that the specified bit is a 1, while if the list contains many entries wherein the specified bit is a 0, it is likely that the specified bit is a 0. The list therefore indicates for each bit whether the bit is a 1 or a 0, and this information is used as a priori information by the decoder.

A more complete understanding of the present invention, as well as further features and advantages of the invention, will be apparent from the following Detailed Description and the accompanying drawings.

BRIEF DESCRIPTION OF THE DRAWINGS

FIG. 2 illustrates a process of decoding according to the present invention;

FIG. 10 illustrates the performance of additional encoding and decoding techniques according to the present invention.

DETAILED DESCRIPTION

Figure 1A:
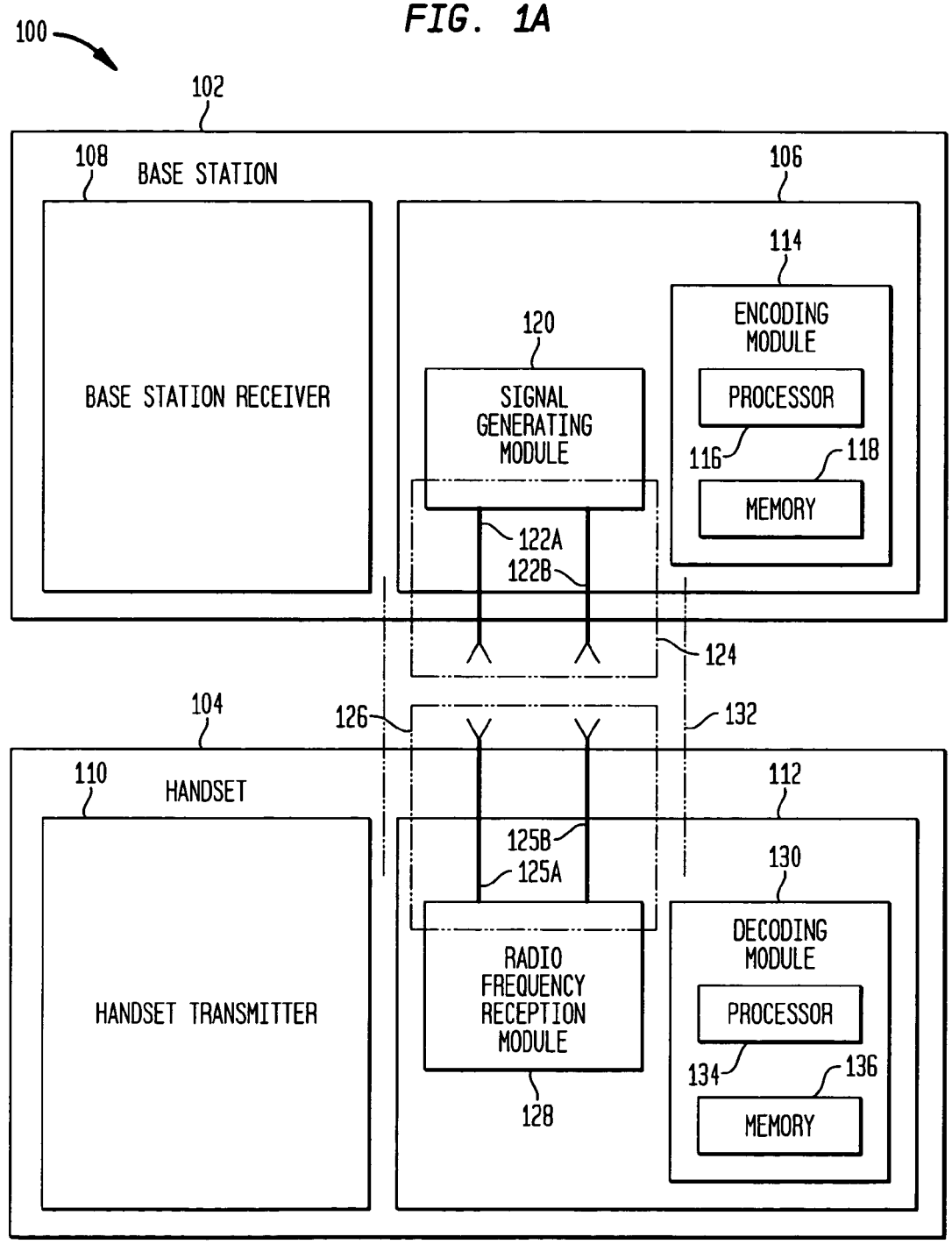
FIG. 1A illustrates a wireless base station and handset employing the techniques of the present invention.

FIG. 1A illustrates a wireless communication system 100 including a base station 102 and a handset 104 according to an aspect of the present invention. The base station 102 includes a base station transmitter 106 and a base station receiver 108. The handset 104 includes a handset transmitter 110 and a handset receiver 112. To avoid duplication of description, only the base station transmitter 106 and the handset receiver 112 are discussed in detail here, as in this embodiment the handset transmitter 110 operates similarly to the base station transmitter 106 and the base station receiver 108 operates similarly to the handset receiver 112.

The base station transmitter 106 includes an encoding module 114 including a processor 116 and memory 118. The processor 116 may suitably be a digital signal processor (DSP), or a combination of DSP's, or may be any other suitable processor or combination of processors. The base station transmitter 106 also includes a signal generating module 120 and transmit antennas 122A and 122B, comprising a multiple transmit antenna array 124. While two antennas 122A and 122B are shown here for ease of illustration and discussion, it will be recognized that additional antennas may be employed as desired for a particular environment or application.

The handset receiver 112 includes receive antennas 125A and 125B, comprising a multiple receive antenna array 126. As with the array 124, it will be recognized that the array 126 may include additional antennas as desired or needed for a particular environment or application.

The handset receiver 112 also includes a radio frequency reception module 128 and a decoding module 130. The base station transmitter 106 transmits signals to the handset receiver 112 over a channel 132 formed by the signal generating module 120, the multiple transmit antenna array 124, the multiple receive antenna array 126 and the radio frequency reception module 128. The signal generating module 120 receives encoded symbols generated by the encoding module 114 and produces radio frequency (RF) signals to communicate the symbols to the handset receiver 112 over the channel 132.

Upon receiving signals from the channel 132, the reception module passes the signals to the decoding module 130. The decoding module 130 includes a processor 134 and memory 136 and processes the signals to detect symbols and to decode the symbols in order to identify the binary data encoded by means of the symbols.

A variety of techniques for forming a wireless channel provided by the use of multiple transmit and receive antennas exist. One implementation of particular interest is a multiple-input multiple-output channel, and the channel 132 may suitably be implemented as a multiple-input multiple-output channel employing M transmit antennas and N receive antennas. For simplicity of illustration and explanation, the values of M and N are both 2 in the present exemplary embodiment, because there are two transmit antennas 122A and 122B and two receive antennas 125A and 125B. However as noted above, more than two transmit and receive antennas may be employed, leading to values of M and N that are greater than 2. Moreover, the number of transmit and receive antennas need not be equal, so that it is possible for M and N to have different values. A multiple-input multiple-output channel may suitably be modeled as follows.

The transmitted symbols may be referred to as the vector s which is an M×1 vector of symbols whose entries are chosen from a complex constellation. The constellation may be constructed, for example, by quadrature phase shift keying (QPSK) or quadrature amplitude modulation (QAM). The constellation includes $2^{M_C}$ possible signal points, where $M_C \geq 1$. The vector s may be known as the vector constellation signal. The received signals may be referred to as the vector channel symbol y, which is an N×1 vector of received signals. The vector y may be expressed as follows $$y=Hs+n, \qquad (1)$$

where H is a complex matrix, known perfectly to the receiver, and n is a vector of independent zero mean complex Gaussian noise entries with a variance of $\sigma^2$ per real component. The vector s may be expressed as $[s_1, \ldots, s_M]^T$, and obeys the component-wise energy constraint $E\|s_m\|^2=E_s/M$. This normalization makes the total transmitted power $E_s$.

Many narrowband flat-fading space-time transmission implementations can be modeled using the above descriptions and assumptions. One popular implementation is the Bell Labs layered space time architecture (BLAST). BLAST uses transmit antennas to send a layered structure of symbols. In this implementation, M is the number of transmit antennas, N is the number of receive antennas and H is the true multiple-input multiple-output matrix channel. Other examples include orthogonal designs and LD codes where H is an effective channel derived from one or more uses of the true channel. In such a case, M and N are generally proportional to the numbers of transmit and receive antennas but do not represent the exact numbers of transmit and receive antennas. In the present discussion, any use of transmit antennas such that H represents the true channel is referred to as direct transmission. BLAST is an example of a system using direct transmission.

The vector model described in equation (1) represents the transmission of a continuous stream of data bits, separated into blocks representing uses of the channel. For any given block, the components of the symbol vector s are obtained using the mapping function $s_m = \text{map}(x^{<m>})$, m=1, ... ,M where $x^{<m>}$ is an $M_C \times 1$ vector, or block, of data bits, and $M_C$ is the number of bits per constellation symbol. The vector of bits transmitted during one application of the model defined by equation (1) is written as x and is obtained by concatenating $x^{<1>}, \ldots, x^{<M>}$ such that the transmitted vector constellation symbol is s=map(x). The uncoded transmitted information rate is then $M \cdot M_C$ bits per use of the channel. A sequence of blocks may be designated by $x^{(1)}, x^{(2)}, \ldots$ The blocks $x^{(1)}, x^{(2)}, \ldots$ are properly considered to be the output of a channel code of rate $R \leq 1$ that introduces redundancy and correlation between its entries. The transmitted information rate is then $RMM_C$ bits per effective channel use. In such a case, detection optimally takes place by operating jointly on all blocks using knowledge of the correlations across blocks introduced by the channel code, with decoding taking place using likelihood information on all detected blocks. The present invention provides iterative techniques for accomplishing joint detection and decoding.

The channel code and the multiple-input multiple-output (MIMO) channel may be regarded as a serially concatenated arrangement, with an outer channel encoder that typically produces a convolutional or turbo code, a bit interleaver and an inner space-time constellation mapper with block encoding matrix H. To decode $x^{(1)}, x^{(2)}, \ldots$ optimally, a joint detection and decoding technique should compute the likelihood of each bit given all the blocks of received complex data $y^{(1)}, y^{(2)}, \ldots$ and the constraints imposed by the channel codes, that is, the likelihood, given all the blocks of received data and the other constraints, that a bit belongs to a particular symbol.

Solving for likelihoods directly is typically computationally infeasible. Therefore, a detection and decoding technique according to the present invention employs an iterative process to estimate the likelihood that a bit belongs to a particular symbol. A MIMO detector incorporates soft reliability information provided by a channel decoder, and the channel decoder in its turn incorporates soft information provided by the MIMO detector. Information between the detector and the decoder is exchanged in an iterative fashion until desired performance is achieved.

Maximizing the a posteriori probability for a given bit minimizes the probability of making an error on that bit. That is, maximizing the probability that a bit belongs to a particular symbol minimizes the probability that the bit has been assigned to the symbol in error. The a posteriori probability is usually expressed as a log-likelihood ratio value, or L-value. L-values provide a convenient notation for describing the operation of iterative decoding algorithms. Add or subtract operations are used to separate a priori, or old, information from new, or extrinsic, information. A decision is made to designate a bit as a "1" or a "0" based on the sign of the L-value used to decide on the value of the bit. The magnitude of the L-value indicates the reliability of the decision, with L-values having a high magnitude indicating a high confidence that the decision is correct, and L-values with a magnitude near 0 indicate that the decision as to whether the bit is a "1" or a "0" is unreliable.

Figure 1B:
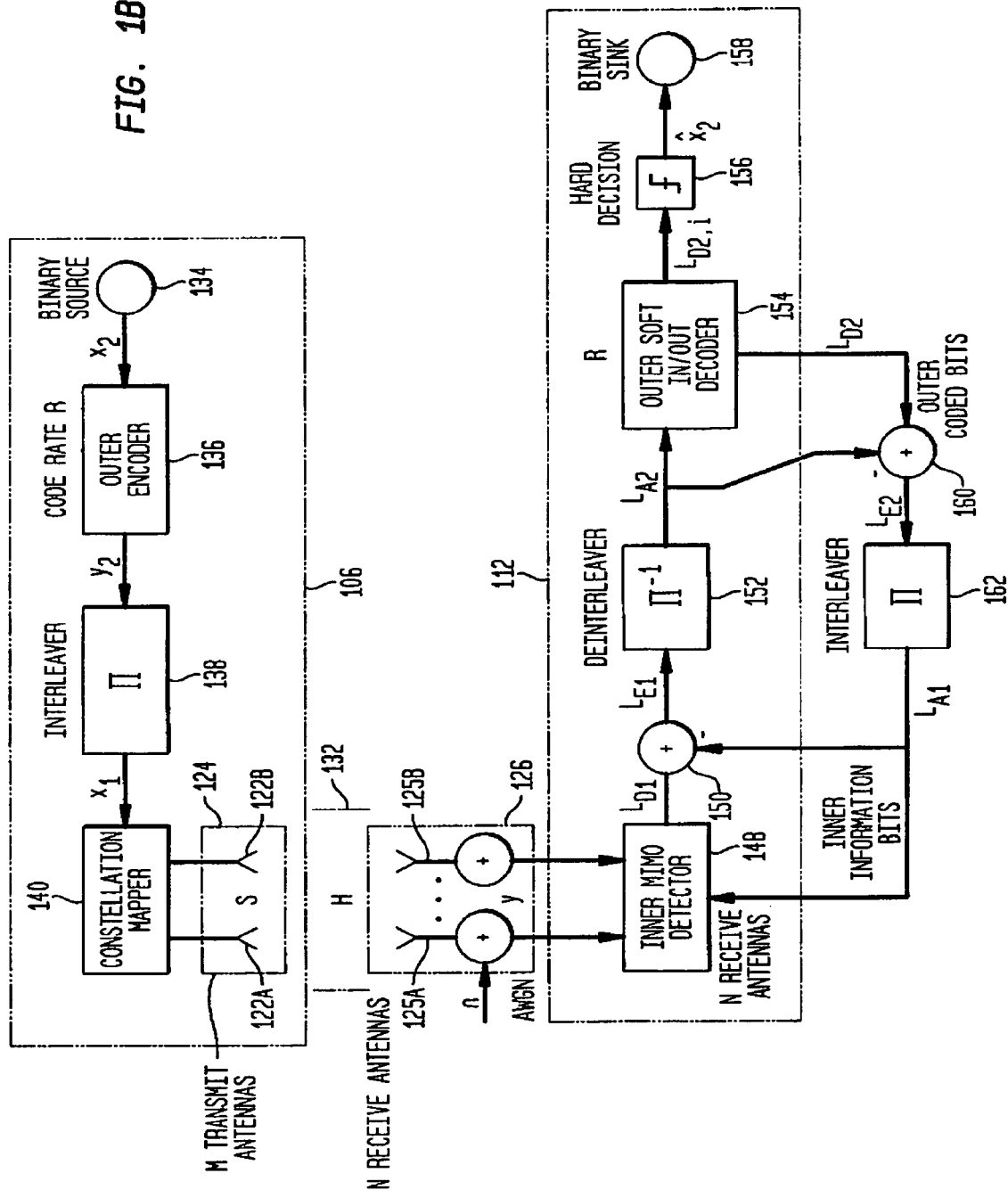
FIG. 1B illustrates functional aspects of a transmitter and receiver according to the present invention.

FIG. 1B illustrates a functional diagram of the base station transmitter 106 and the handset receiver 112, showing the various operational modules that may suitably be implemented as functions performed by the encoding module 114, the signal generating module 120, the radio frequency reception module 128 and the decoding module 130.

The handset receiver 112 employs various L-values in order to make decisions about the values of bits received from the base station transmitter 106. The transmitter 106 comprises a binary source 134 providing information to be encoded for transmission, in the form of a bit stream denoted as the vector $x_2$. In the present discussion, the subscript "2" is used to denote variables used as inputs to or produced as outputs by modules that perform operations involving encoding and decoding a channel code and the subscript "1" is used to denote variables used as inputs to or produced as outputs by modules that perform operations involving encoding and decoding symbols.

The vector $x_2$ is provided to an outer encoder 136, which performs outer encoding to add redundancy and error correction, at a code rate "R". The outer encoder produces a vector channel symbol $y_2$, which represents the original bit stream encoded with a channel code to add redundancy and error correction. Encoding the bit stream with a channel code involves adding bits to the original bit stream with the added bits providing information that can be used to detect and correct errors or to recover dropped bits. The vector channel symbol $y_2$ is provided to an interleaver 138, which rearranges the bits to produce the vector $x_1$. The vector $x_1$ is provided to a constellation mapper 140, which maps elements of the vector $x_1$ to symbols chosen from a constellation of available symbols. The constellation mapper 140 produces a symbol vector s, which is transmitted using the array 124 of M transmit antennas. In the presently illustrated embodiment, the number of transmit antennas is 2, but for purposes of generality will be referred to as "M" because the number of antennas need not be 2 and need not be equal to the number of receive antennas.

The transmitter 106 transmits the representation of a symbol vector s over the transmission channel 132. The handset receiver 112 receives the contents of the channel 132, which constitute the channel observation vector y. The vector y includes the symbol vector s, the channel vector H and a noise vector n, constituted as shown in equation (1) above. The receiver 112 employs the array 126 of N receive antennas. As noted above with respect to the transmit antennas, in the presently illustrated embodiment, the number of transmit antennas is 2, but for purposes of generality will be referred to as "N". The array 126 of receive antennas provides signals to an inner multiple-input multiple-output (MIMO) detector 148. The function of the MIMO detector is to identify symbols conveyed by the channel vector y, by providing an indication of the identity of each symbol as well as an indicator of the reliability of the identification.

The MIMO detector 148 receives a priori L-values $L_{A_1}$ that are used to enhance the accuracy of the output produced by the MIMO detector 148 by providing the detector 148 with known information relating to the characteristics of the channel. This known information may be used by the MIMO detector in order to help indicate which symbols are and are not indicated by the channel vector by informing the MIMO detector 148 which combinations are and are not permitted by the channel code. The knowledge that certain combinations are not permitted by the channel code can be used by the MIMO detector 148 to reject certain symbols as possibilities and to accept others.

The MIMO detector produces a posteriori L-values $L_{D_1}$ indicating which symbols have been detected, and the reliability of the detection. A first summer 150 extracts the a priori values $L_{A_1}$ to produce extrinsic L-values $L_{E_1}$ and passes the L-values $L_{E_1}$ to a deinterleaver 152. The deinterleaver 152 produces a priori L-values $L_{A_2}$. The a priori values $L_{A_2}$ are provided to an outer soft in/soft out decoder 154, performing decoding at a code rate "R" to produce a posteriori L-values $L_{D_2}$. The L-values $L_{D_2}$ indicate the bits present within the channel code, as well as an indication as to the reliability of each indication. The decoder 154 also produces a posteriori L-values $L_{D_2,i}$, indicating the identity of each bit along with the reliability of the identity indication. The a posteriori values $L_{D_2,i}$ are used as input to a hard decision module 156, which makes decisions about the identity of each bit based on the indication provided by the a posteriori values $L_{D_2,i}$ and the reliability indicator showing the reliability of each indication.

The L-values $L_{D_2}$ produced by the decoder 154 are provided to a second summer 160, which extracts the a priori L-values $L_{A_2}$ to produce a new set of extrinsic L-values $L_{E_2}$. These values are provided to an interleaver 162, which produces the a priori L-values $L_{A_1}$ and provides them to the first summer 150. The interleaver 162 also provides the a priori L-values $L_{A_1}$ to the inner MIMO detector 148.

The hard decision module 156 produces a decoded information vector $\hat{x}_2$, which is provided to a binary sink 158, representing whatever devices or modules require the decoded information. The decoded information vector $\hat{x}_2$ represents the information content of the symbol vector s, and therefore the channel symbol y, and represents the useful information content transmitted from the transmitter 106 to the receiver 112.

The receiver 112 employs iterative techniques according to the present invention to achieve an efficient joint computation of the various L-values, in order to achieve detection and decoding at rates near the capacity of the channel provided by the use of multiple transmit and receive antennas. Typically, only extrinsic information is exchanged between processing cycles, and as noted above, the L-values are used to tell whether a bit is a "1" or a "0." As used here, the logical "0" for a bit is represented by amplitude level $x_k=-1$ and the logical "1" for a bit is represented by $x_k=+1$. In order to make this determination, it is necessary to maximize the extrinsic L-values by searching for candidate symbols within the symbol constellation in order to identify the symbols in the symbol constellation that yield the highest probability that the identified bits within the symbols are those represented by the channel observation vector y. An overview of the detection and decoding process carried out by the receiver 112 is presented in connection with the discussion of FIG. 2 below, followed by an explanation of the mathematical background underlying the decoding process, as well as techniques for conducting a computationally efficient search for candidate symbols.

FIG. 2 illustrates a process 200 of symbol detection and decoding according to the present invention. The process 200 may suitably be performed by a receiver such as the receiver 112 of FIGS. 1A and 1B, having N receive antennas and receiving transmissions from a transmitter similar to the transmitter 106 of FIGS. 1A and 1B, having M transmit antennas, the transmitter and the receiver employing a channel for the transmission of symbols drawn from a constellation of available symbols.

At step 202, channel observations suitably comprising inner coded bits, noise and outer coded bits are received, suitably at a detector similar to the MIMO detector 154 of FIG. 1B. The channel observations are designated herein as a plurality of vector channel symbols y, and are suitably modeled according to the model presented in equation (1). At step 204, a priori information $L_{A_1}$ is applied to the channel observations to compute new, or inner extrinsic, information $L_{E_1}$, for each bit per vector channel symbol y. The inner extrinsic information $L_{E_1}$ indicates the identity of each bit and the reliability of the indication. Each vector channel symbol has $M \cdot M_C$ coded bits. At step 206, $L_{E_1}$ is used to create become outer a priori information $LA_2$. Creation of outer a priori information $L_{A_2}$ may suitably be achieved by interleaving the inner extrinsic information $L_{E_1}$. However, interleaving is not necessary and the necessary information for use as the outer a priori information $L_{A_2}$ is contained in the inner extrinsic information $L_{E_1}$. The outer a priori information $L_{A_2}$ is used to perform decoding in order to indicate bits in a bitstream represented by the channel observations. At step 208, the a priori information $L_{A_2}$ is used to calculate outer extrinsic information $L_{E_2}$ indicating the identity of the bits in the bitstream and the reliability of the indication. Calculation of the extrinsic information $L_{E_2}$ may suitably be accomplished by a soft-input soft-output decoder similar to the decoder 154 of FIG. 1. At step 210, the outer extrinsic information $L_{E_2}$ is used to create inner a priori information $L_{A_1}$ to be used to improve the accuracy of the identification of bits represented by the channel observations. Steps 204–210 are repeated until a predetermined goal is met, for example until a predetermined number of iterations have been performed, until a desired level of accuracy has been achieved, or until a worthwhile increase in accuracy is no longer being achieved with each iteration, indicating that the maximum accuracy has been achieved that can be achieved with reasonable efficiency.

Once the predetermined goal is met, the process proceeds to step 212 and the extrinsic information is used to reconstruct the transmitted bitstream.

Successful decoding of the channel symbol y requires computation or reasonably accurate estimation of the L-value $L_E(x_k|y)$, that is, the identity of the bit $x_k$ along with an indication of the reliability of the identification. The following discussion provides background for a solution to the L-value $L_E(x_k|y)$ and introduces efficient techniques according to the present invention for estimating its value.

For a block of bits x corresponding to one use of the linear model shown in equation (1), the a posteriori L-value of the bit $x_k$, $k=0, \ldots, M \cdot M_C-1$, conditioned on the received vector channel symbol y, is $$L_D(x_k \mid y) = \ln \frac{P[x_k = +1 \mid y]}{P[x_k = -1 \mid y]} \quad (2)$$

It is assumed that the bits comprising x have been encoded with a channel code, but that an interleaver at the encoder has been used to insert bits from other blocks into the block x so that the bits within x are approximately statistically independent from one another. Using Bayes's theorem, and taking advantage of the independence of $x_0, \ldots, x_{M \cdot M_C-1}$ by splitting up the joint probabilities into products, the soft output value can be written as $$L_D(x_k \mid y) = L_A(x_k \mid y) + \ln \frac{\sum_{x \in X_{k,+1}} p(y \mid x) \cdot \exp \sum_{x \in J_{k,+1}} L_A(xj)}{\underbrace{\sum_{x \in X_{k,-1}} p(y \mid x) \cdot \exp \sum_{x \in J_{k,+1}} L_A(xj)}_{L_E(x_k \mid y)}} \quad (3)$$

where $X_{k,+1}$, is the set of $2^{M^*M_c-1}$ bit vectors x having $x_k=+1$, that is $$X_{k,+1}=\{x|x_k=+1\}, X_{k,-1}=\{x|x_k=+1\}, \quad (4)$$

$J_{k,x}$ is the set of indices j with $$J_{k,x}=\{j|j=0, \ldots, M \cdot M_C-1, j \neq k \text{ and } x_j=-1\}, \quad (5)$$

and $$L_A(x_j) = \ln \frac{P[x_j=1]}{P[x_j=-1]} \quad (6)$$

By multiplying the numerator and denominator by $$\exp\left[-\frac{1}{2} \sum_{k=0}^{M \cdot M_c-1} L_A(x_k)\right],$$

equation (3) may be rewritten as $$L_D(x_k \mid y) = L_A(x_k \mid y) + \ln \frac{\sum_{x \in X_{k,+1}} p(y \mid x) \cdot \exp\left(\frac{1}{2} x_{[k]}^T \cdot L_{A,[k]}\right)}{\underbrace{\sum_{x \in X_{k,-1}} p(y \mid x) \cdot \exp\left(\frac{1}{2} x_{[k]}^T \cdot L_{A,[k]}\right)}_{L_E(x_k \mid y)}}, \quad (7)$$

where x[k] denotes the subvector of x obtained by omitting its kth element $x_k$ and $L_{A,[k]}$ denotes the vector of all $L_A$ values, also omitting $x_k$. Thus, $L_D$ can be written as a sum of a priori L-value $L_A$ and extrinsic L-value $L_E$.

In order to determine the a posteriori L-values $L_D$ associated with inner encoding, equation (7) may be rewritten using the subscript "1", yielding the following:

$$L_{D_1}(x_{1,k} \mid y) = L_{A_1}(x_{1,k} \mid y) + \ln \frac{\sum_{x \in X_{k,+1}} p(y \mid x) \cdot \exp\left(\frac{1}{2} x_{1,[k]}^T \cdot L_{A_1,[k]}\right)}{\underbrace{\sum_{x \in X_{k,-1}} p(y \mid x) \cdot \exp\left(\frac{1}{2} x_{1,[k]}^T \cdot L_{A_1,[k]}\right)}_{L_{E_1}(x_{1,k} \mid y)}} \quad (8)$$

Equation (8) applies to the channel model (1), where $x_1$ represents the coded bits to be transmitted and y is the vector measurement obtained at the receiver 112. However, equation (7) may also be applied to the channel code, that is, the error correcting code. Equation (7) then indicates the a posteriori L-value obtained from a posteriori probability (APP) decoding of the outer channel code. Thus, the channel decoder processing can also be decomposed into a priori and extrinsic components, yielding the following equation for the channel code:

$$L_{D2}(x_{2,k} \mid L_{A_2}) = L_{A_2}(x_{2,k} \mid y) + \ln \frac{\sum_{x_2 \in X_{k,+1}} \exp\left(\frac{1}{2} x_{2,[k]}^T \cdot L_{A_2,[k]}\right)}{\underbrace{\sum_{x_2 \in X_{k,-1}} \exp\left(\frac{1}{2} x_{2,[k]}^T \cdot L_{A_2,[k]}\right)}_{L_{E_2}(x_{2,k} \mid L_{A_2,[k]})}} \quad (9)$$

In this equation, the raw data bits are denoted $x_2$.

The L-value $L_{D_1}$ is computed by the MIMO detector 154. An essential part of this computation is computing the likelihood function p(y|x). This computation can be derived from equation (1) to yield the following:

$$p(y \mid s) = \text{map}(x) = \frac{\exp\left[-\frac{1}{2\sigma^2} \cdot \|y - H \cdot s\|^2\right]}{(2\pi\sigma^2)^N} \quad (10)$$

For the L-value calculation, only the term in the exponent is relevant and the constant factor outside the exponent can be omitted.

It is desirable to simplify the computations performed to compute the various L-values, in order to reduce the processing task to be performed, so that the necessary processing can be performed by components likely to be employed by a receiver suitable for use in a communication system employing the teachings of the present invention. Evaluation of the numerator and denominator in the computation of equation (7) may be simplified through the use of the Jacobian logarithm $$jac\ln(a_1, a_2) := \ln(e^{a_1} + e^{a_2}) = \max(a_1, a_2) + \underbrace{\ln(1 + e^{-|a_1-a_2|})}_{r(|a_1-a_2|)}, \quad (11)$$

where r(·) can be viewed as a refinement of the coarse approximation $\max(a_1, a_2)$. On a digital signal processor (DSP) with no exponential or logarithm functions, a Jacobian logarithm approximation can be obtained by storing r(·) in a lookup table. To compute the Jacobian logarithm to $$\sum_{i=1}^{N_i} e^{a_i}$$

for $N_i>2$, it is possible to use a recursive calculation by setting a variable v to negative infinity, and setting the value of v to $jac\ln(v,a_i)$ for every value of i from 1 to $N_i$.

Further simplifications are possible by using a maximum logarithm approximation, which omits r(·) altogether. Often, this approach provides only a very small loss of accuracy as compared to the Jacobian logarithm. With the max logarithm approximation, the extrinsic L-value used in equation (7) is as follows:

$$L_E(x_k \mid y) \approx \frac{1}{2} \max_{x \in X_{k,+1}} \left\{ -\frac{1}{\sigma^2} \|y - H \cdot s\|^2 + x_{[k]}^T \cdot L_{A,[k]} \right\} - \frac{1}{2} \max_{x \in X_{k,-1}} \left\{ -\frac{1}{\sigma^2} \|y - H \cdot s\|^2 + x_{[k]}^T \cdot L_{A,[k]} \right\} \quad (12)$$

However, even with these simplifications, the complexity of computing $L_E(x_k \mid y)$ increases exponentially with the length of the bit vector x, and also increases exponentially with the number of symbols in the constellation. To find the maximizing hypotheses in equation (12) for each $x_k$, a search must be made in each term over $2^{M \cdot M_C - 1}$ hypotheses. For even a moderate block size M or number of bits per symbol $M_C$, this complexity may be overwhelming. For example, if the model of equation (1) is used with eight transmit and eight receive antennas and direct transmission of a 16-QAM constellation, then $M \cdot M_C - 1 = 31$ and $2^{M \cdot M_C - 1} 2 * 10^9$. In order to reduce the computational load, the present invention provides an approximation for equation (12) that avoids this exhaustive search.

In order to reduce the complexity of the search, the MIMO detector 154 employs a process similar to that of sphere decoding. Conventional sphere decoding avoids an exhaustive search by examining only those points that lie inside a sphere with a radius large enough to contain the solution to the desired problem. As will be discussed further below in connection with FIG. 6, the present invention employs a process that improves upon the efficiency of sphere decoding by creating a list of solutions having the smallest radii.

A simple way to approximate the solution to equation (12) is to exclude from the search values of ŝ for which $$\|y - H\hat{s}\|^2 \quad (13)$$

is relatively large and to include only the hypotheses for which the value of (13) is relatively small. In practice, only a relatively small number of hypotheses exists for which the value of (13) is small. This set of hypotheses may be referred to as a candidate list, and a search can be conducted among hypotheses in this candidate list that maximize the two terms in equation (12). In order to accomplish this task, the MIMO decoder employs a decoding technique similar to sphere decoding, in order to rapidly find an appropriate candidate list. This technique is capable of searching through complex constellations and provides for a much less computationally complex search than standard sphere decoding.

The sphere decoding solves the equation $$\min_{s \in \Lambda} (s - \hat{s})^T H^T H (s - \hat{s}), \quad (14)$$

where ŝ is the center of the search sphere, and Λ is the lattice defined by having each entry of the M-dimensional vector s be taken from a constellation of $2^{M_C}$ consecutive integers. Solving equation (14) is generally difficult unless H has orthogonal columns, in which case the M-dimensional search constitutes M simple 1-dimensional searches. If H does not have orthogonal columns, the M-dimensional search becomes an exhaustive search over $2^{M \cdot M_C}$ different hypotheses.

Sphere decoding avoids this exhaustive search by examining only those points that lie inside a sphere $$(s - \hat{s})^T H^T H (s - \hat{s}) \leq r^2 \quad (15)$$

having a radius r large enough to contain the solution.

It is convenient to assume that $r \geq 0$ has been chosen so that the sphere (15) contains the solution to equation (14) and possibly additional lattice points. U is an upper triangular M×M matrix chosen such that $U^T U = H^T H$ using, for example, Cholesky factorization. The entries of U may be denoted $u_{ij}$, $i \leq j = 1, \ldots, M$. If it assumed that $u_{ii} > 0$, equation (15) may be rewritten as follows $$(s - \hat{s})^T U^T U (s - \hat{s}) = \sum_{i=1}^{M} u_{ii}^2 \left[ s_i - \hat{s}_i + \sum_{j=i+1}^{M} \frac{u_{ij}}{u_{ii}} (s_j - \hat{s}_j) \right]^2 \leq r^2. \quad (16)$$

Each term in the sum over i is non-negative. Sphere decoding establishes bounds on $s_1, \ldots s_M$ by examining these terms in subsets.

Beginning with i=M and discarding the terms i=1, ..., M−1 and making the appropriate substitutions into equation (16) yields $$u_{MM}^2 (s_M - \hat{s}_M)^2 \leq r^2, \text{ or}$$

$$\left\lceil \hat{s}_M - \frac{r}{u_{MM}} \right\rceil \leq s_M \leq \left\lfloor \hat{s}_M - \frac{r}{u_{MM}} \right\rfloor. \quad (17)$$

The function ⌈·⌉ finds the smallest integer greater than or equal to the argument, and the function ⌊·⌋ finds the largest integer less than or equal to its argument. These functions are used because the constellation is assumed to be a set of consecutive integers. After computing the lower and upper bounds in equation (17), sphere decoding involves the choice of a candidate value for $S_M$ and the computation of the implications of this choice on $s_{M-1}$. Determination of the influence of the choice of $s_M$ on $s_{M-1}$ using sphere decoding involves examining the two terms i=M−1 and M in equation (16) and discarding the remaining terms to obtain the inequality $$u_{M-1,M-1}^2 \left[ s_{M-1} - \hat{s}_{M-1} + \frac{u_{M-1,M}}{u_{MM}} (s_M - \hat{s}_M) \right]^2 + u_{MM}^2 (s_M - \hat{s}_M)^2 \leq r^2,$$

which yields the upper bound $$s_{M-1} \leq \left\lfloor \hat{s}_{M-1} + \frac{\sqrt{r^2 - u_{MM}^2 (s_M - \hat{s}_M)^2}}{u_{M-1,M-1}} - \frac{u_{M-1,M}}{u_{MM}} (s_M - \hat{s}_M) \right\rfloor \quad (18)$$

and a corresponding lower bound. A candidate for $s_{M-1}$ is chosen within the range given by the upper and lower bounds, then a candidate for $s_{M-2}$ is chosen in a similar way, and so on.

Eventually, one of two things happens. Either $s_1$ is reached and a value is chosen within the computed range, or it is discovered that for some $s_m$, no point in the constellation falls within the upper and lower bounds. In the first case, a candidate solution for the vector s has been found. The radius for the candidate solution is computed and the search process is begun again using the new smaller radius to search for any better candidates.

The occurrence of the second case, that is, failure to find a point in the constellation, indicates that at least one bad candidate choice must have been made for $s_{m+1}, \ldots, s_M$. The choice for $s_{m+1}$, which immediately preceded the attempt for $s_m$, is revised by finding another candidate within its range. An attempt is then made to find a candidate value for $s_m$. If no more candidates are available at $s_{m+1}$, an attempt is made at $s_{m+2}$, and so on.

Sphere decoding as described above applies to a real system of equations when s is chosen from a real lattice, and can be applied to the complex system of equation (1) only when the real and imaginary components of y, H and s can be decoupled to create a system of real equations with twice the dimension of the original system. This decoupling is possible, for example, when the entries of s are chosen from a QAM constellation. It is not generally possible, however, for PSK or other complex constellations. In order to overcome this obstacle and to generalize the process of detection and decoding, the MIMO detector 154 may suitably employ a process of complex sphere decoding according to the present invention. Complex sphere decoding employs techniques similar to those of conventional sphere decoding, but is adapted to allow searches through complex constellations.

It is desired to solve the equation $$\min_{s \in A}(s - \hat{s})^* H^* H(s - \hat{s}), \quad (19)$$

where $\hat{s}$ and H are complex and A is a complex lattice in the sense that each coordinate of s is chosen from a complex constellation. The complex search sphere is then $$(s-\hat{s})^* H^* H (s-\hat{s}) \leq r^2 \quad (20)$$

Cholesky factorization is employed to find an upper triangular U with $u_{ii}$ real and positive such that $U^*U=H^*H$. Equation (20) may then be written as follows $$(s-\hat{s})^* U^* U(s-\hat{s}) = \sum_{i=1}^{M} u_{ii}^2 \left| s_i - \hat{s}_i + \sum_{j=i+1}^{M} \frac{u_{ij}}{u_{ii}}(s_j - \hat{s}_j) \right|^2 \leq r^2 \quad (21)$$

As in the real case, these terms are non-negative and are examined in subsets to find bounds on $s_1, \ldots s_M$.

The term i=M yields the equation $$|s_M - \hat{s}_M| \leq \frac{r}{u_{MM}}. \quad (22)$$

This inequality limits the search to points of the constellation contained in a complex disk of radius $$\frac{r}{u_{MM}}$$

centered at $s_M$. These points are easily found when the constellation forms a complex circle, as occurs in phase shift keying (PSK). The intersection of a disk and a circle is generally an arc, and the angular sweep of this arc can be obtained analytically by solving for the overlap of the search disk and the constellation circle.

It is assumed that $s_M = r_C e^{j\theta_M}$, where $\theta_M \in \{0, 2\pi/2^{M_C}, \ldots, 2\pi(2^{M_C}-1)/2^{M_C}\}$ are the $2^{M_C}$ angles of the $2^{M_C}$-PSK constellation, and $r_C>0$ is the radius of the circle formed by the PSK constellation. It is further assumed that $\hat{s}_M = \hat{r}_C e^{j\hat{\theta}_M}$ where $\hat{r}_C > 0$. Then equation (22) becomes $$|s_M - \hat{s}_M|^2 = r_C^2 + \hat{r}_C^2 - 2r_C\hat{r}_C\cos(\theta_M - \hat{\theta}_M) \leq \frac{r^2}{u_{MM}^2},$$

which yields $$\cos(\theta_M - \hat{\theta}_M) \geq \frac{1}{2r_C\hat{r}_C}\left[r_C^2 + \hat{r}_C^2 - \frac{r^2}{u_{MM}^2}\right] =: \eta \quad (23)$$

If $\eta>1$, then the search disk does not contain any point of the PSK constellation. If $\eta>-1$ then the search disk includes the entire constellation. For values of $\eta$ such that $-1 \leq \eta \leq 1$, the arc is described by $$\theta_M - \hat{\theta}_M \leq \cos^{-1}\eta,$$

on the assumption that $$0 \leq \cos^{-1} \leq \pi.$$

Alternatively, the range of allowable constellation points can be designated as follows $$\left\lceil \frac{2^{M_c}}{2\pi}(\hat{\theta}_M - \cos^{-1}\eta) \right\rceil \leq \frac{2^{M_c}}{2\pi}\theta_M \leq \left\lfloor \frac{2^{M_c}}{2\pi}(\hat{\theta}_M + \cos^{-1}\eta) \right\rfloor \quad (24)$$

A candidate $s_M$ may be chosen by allowing $\theta_M$ to be a point within the range defined by equation (24). The remainder of the search for a solution proceeds as in the real case, that is, by establishing bounds on $\theta_{M-1}$ by finding an allowable arc using the two terms i=M-1 and M in equation (21), choosing a candidate for $\theta_{M-1}$, and so on.

Figure 3:
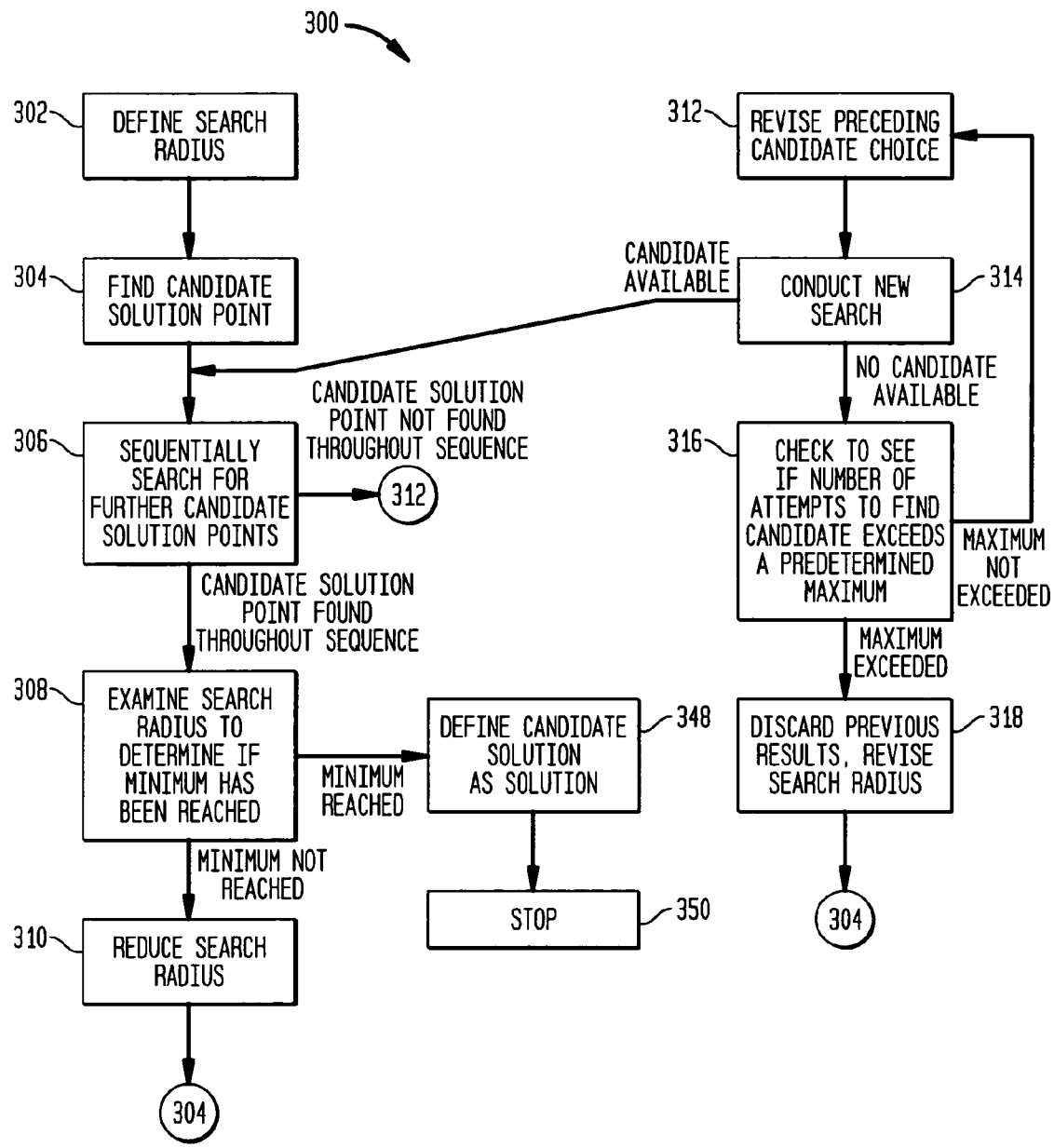
FIG. 3 illustrates a process of complex sphere decoding according to the present invention.

FIG. 3 illustrates a process 300 of complex sphere decoding according to the present invention, implementing the principles described above. At step 302, a search radius is found for a complex search sphere described by equation (20) above, the search radius being defined using equation (22) above. At step 304, a candidate solution point $s_M$ is found by allowing $\theta_M$ to take on a value within the bounds defined by equation (24). At step 306, further solution point are found for $s_{M-1}, s_{M-2}$ and so on, by finding values $\theta_{M-1}$, $\theta_{M-2}$, and so on. If $s_1$ is reached, with a candidate solution point having been found at every step, a candidate solution s has been found, the process proceeds to step 308 and the search radius is examined to determine whether a minimum search radius has been achieved. This is done by reducing the search radius and searching within the reduced radius to determine if any candidate solutions lie within the reduced search radius. If no candidate solutions lie within the reduced search radius, a minimum search radius has been achieved with the previous radius within which solutions were found.

If a minimum search radius has been achieved, the process proceeds to step 348 and the candidate solution s is defined as the solution. The process then terminates at step 350.

If a minimum search radius has not been achieved, the process proceeds to step 310, the search radius is reduced and the process then returns to step 304 in order to search for a better candidate.

Returning now to step 306, if a search fails to yield a solution within the constellation, this indicates that a bad candidate choice has been made for $s_{m+1}, \ldots s_M$. The process returns to step 312 and the choice which preceded the present attempt is revised by finding another candidate within the range defined by equation (24). The process then proceeds to step 314 and an attempt is then made to find a candidate value for $s_m$. If a candidate value is found, the process returns to step 306. If no more candidates are available at the preceding choice, the process proceeds to step 316 and a check is made to determine if the number of attempts to find a candidate value exceeds a predetermined maximum.

If the number of attempts does not exceed a predetermined maximum, the process returns to step 312. If the number of attempts does exceed the predetermined maximum, this means that the initial choice of search radius was incorrect. In this case, the process proceeds to step 318, the previous results are discarded and the search radius is revised. The process then returns to step 304.

Figure 4:
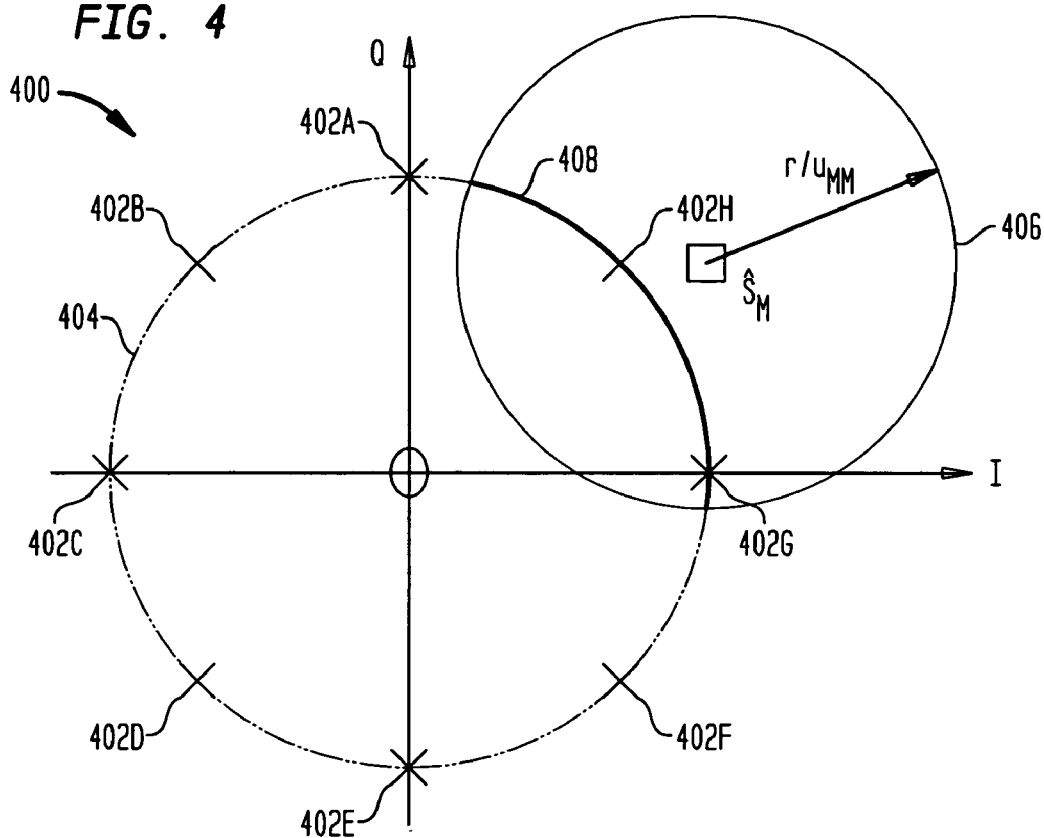
FIG. 4 is a graph illustrating results of complex sphere decoding according to the present invention.

FIG. 4 is a graph 400, providing an illustration of the performance of complex sphere decoding. The graph 400 includes an 8-PSK constellation comprising the points 402A–402H and bounded by the circle 404. The operation of sphere decoding is illustrated by a search disk 406. The solutions provided by sphere decoding are the points 402G and 402H, contained within the arc 408 obtained by the intersection of the circle 404 and the search disk 406.

Figure 5:
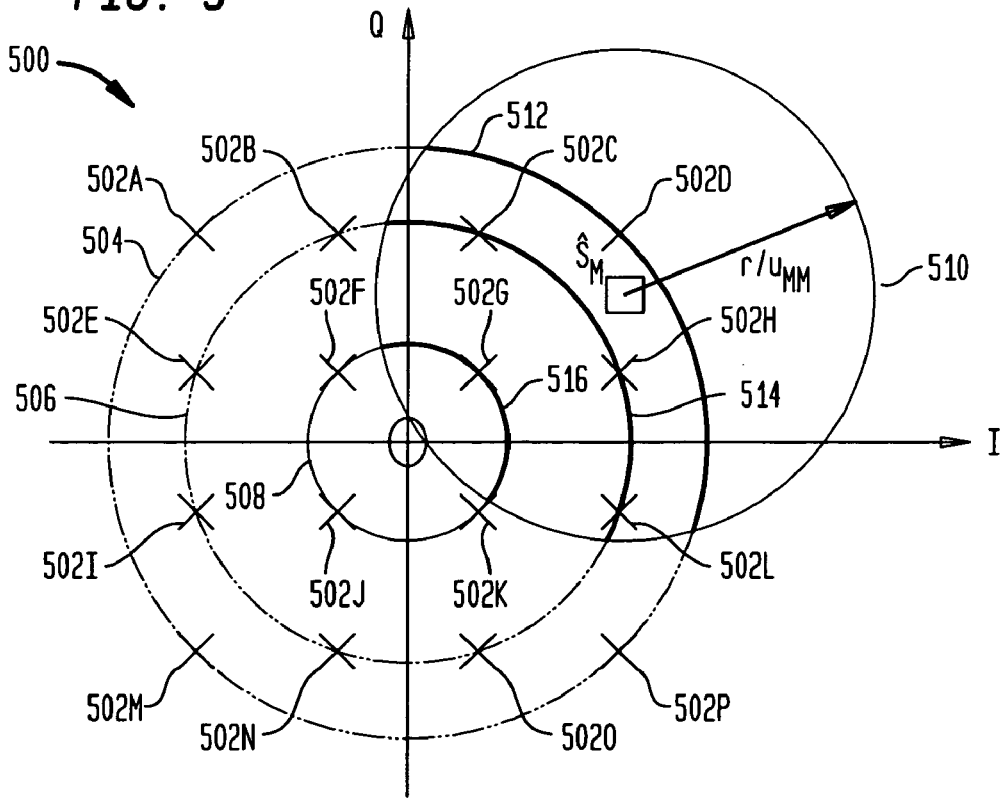
FIG. 5 is a graph illustrating results of complex sphere decoding according to the present invention.

FIG. 5 illustrates a graph 500, providing an additional example of the performance of complex sphere decoding. The graph 500 includes a 16-QAM constellation comprising the points 502A–502P and defined by the concentric circles 504, 506 and 508. The operation of complex sphere decoding is illustrated by a search disk 510, and the points detected are those within the arcs 512, 514 and 516 bounded by the search disk 510 and the circles 504, 506 and 408.

It will be recognized that while the present discussion describes the example of decoding of a symbol belonging to a PSK constellation, the process of complex decoding presented here may be efficiently applied to other complex constellations as well. One significant requirement for efficient decoding is the ability to recognize which constellation points are contained within the search dies for every value of $s_m$. Because identifying constellation points within the search disk is simple when the points are arranged in a circle, it follows that constellation points arranged in concentric circles can also be identified. Solving for points within the search disk requires solving the inequality (23) for three different values of $r_C$. While 16-QAM can also be processed by employing conventional sphere decoding restricted to solving real equations, but such processing requires decoupling the real and imaginary equations by to form a system of real equations that is twice as large. The above-described process of complex sphere decoding has a speed advantage because it does not double the effective dimension of the search lattice.

Conventional sphere decoding provides a solution to equation (14), and the process of complex sphere decoding presented above provides a solution to equation (19). Equation (19) is similar to equation (14), but is modified to adapt equation (14) to complex cases. It can be observed that $$\|y-Hs\|^2 = (s-\hat{s}_c)^* H^* H(s-\hat{s}_c) + y^*(I-H(H^*H)^{-1}H^*)y, \quad (25)$$

where $\hat{s}_c = (H^*H)^{-1}H^*y$ is a "continuous" or unquantized estimate of s. Hence, $$s_{mi} = \operatorname*{argmin}_{s \in \Lambda} \|y - Hs\|^2 = \operatorname*{argmin}_{s \in \Lambda} (s - \hat{s}_C) * H^* H(s - \hat{s}_C). \quad (26)$$

Conventional sphere decoding and complex sphere decoding are well suited for finding the maximum likelihood estimate.

However, neither conventional nor complex sphere decoding is ideally suited for use by the receiver 112. The receiver 112 requires a solution of the value of $L_E(x_k|y)$, that is, the solution that maximizes the two terms of equation (12) above. Therefore, the detector 154 employs a process adapted to provide an efficient solution to equation (12). This process may be referred to as list sphere decoding, because it involves the compilation of a list of candidate solutions and the use of this list to estimate a solution for equation (12).

Figure 6:
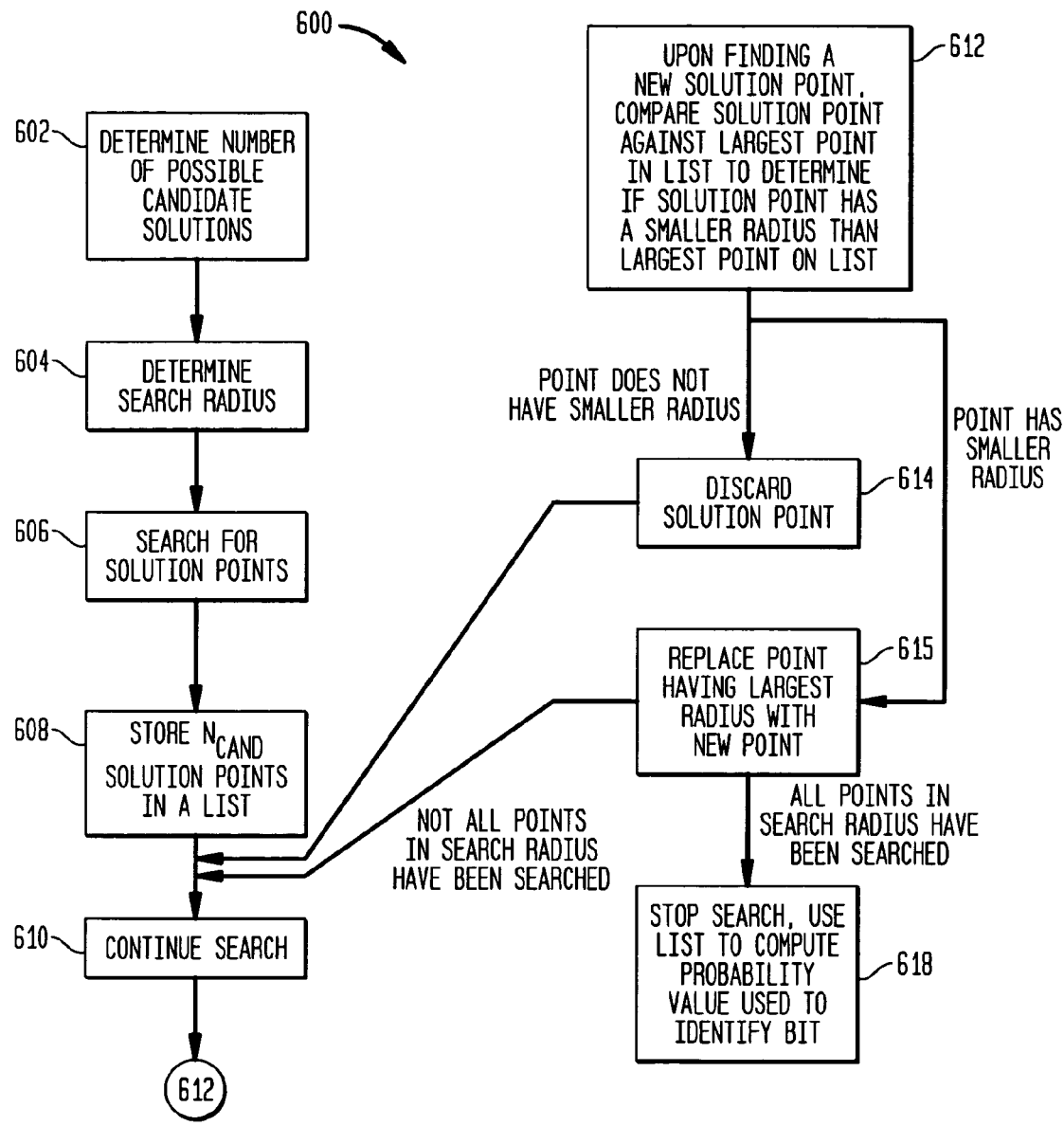
FIG. 6 illustrates a process of list sphere decoding according to the present invention.

FIG. 6 illustrates a list sphere decoding process 600 according to the present invention. The process 600 operates to determine an extrinsic L-value $L_E$, and may suitably be employed by the detector 154 of FIG. 1B, and at step 206 of the process 200 of FIG. 2. The list sphere decoding process 600 may suitably be performed in decoding of information received across a multiple antenna channel, and in such use may be performed for every block channel symbol y which is to be decoded.

At step 602, a predetermined number $N_{cand}$ is established, with $N_{cand}$ having a value within the range $2^{M M_C} \geq N_{cand} \geq 1$, where $N_{cand}$ defines a number of possible candidates for solutions to maximize the value of equation (12). The establishment of $N_{cand}$ may suitably be performed one time for a system with which the process 600 is to be used and may depend on the design of the system, for example including such factors as the number of transmit and receive antennas to be used and the encoding system to be employed. At step 604, a radius r is chosen for a search sphere described by equation (15) above if real decoding is to be performed or equation (20) above if complex decoding is to be performed. At step 606, a search is conducted for solution points within the sphere, the solution points providing a solution to equation (14) above for performance of real decoding or equation (19) above for the performance of complex decoding. At step 608, when a solution point is found, the solution point is stored in a list $\tilde{\mathfrak{I}}$. The radius r of the search sphere is not decreased to correspond to the solution point. The steps 606 and 608 are continued until $N_{cand}$ solution points have been found.

Once $N_{cand}$ solution points have been found, the process proceeds to step 610 and a continued search for solution points is conducted.

At step 612, when a new solution point is found, the solution point is compared against the list $\Im$ to determine if the solution point has a smaller radius, that is, is found within a smaller radius, than any of the solution points already in the list $\Im$. If the solution point does not have a smaller radius, the process proceeds to step 614, the solution point is discarded and the process returns to step 610. If the solution point has a smaller radius than any of points already stored in the list $\Im$, the process proceeds to step 615 and the solution point replaces the point in the list $\Im$ that has the largest radius. If not all points in the search radius have been searched, the process returns to step 610 and the search continues. If all points in the search radius have been searched, the process proceeds to step 618 and the list is complete, comprising the $N_{cand}$ solution points with the smallest radii.

At step 618, the list $\Im$ is used to provide a solution to the following equation $$L_E(x_k \mid y) \approx \frac{1}{2} \max_{\hat{x} \in \Im \cap X_{k,+1}} \left\{ \frac{1}{\sigma^2} \|y - H \cdot \hat{s}\|^2 + \hat{x}_{[k]}^T \cdot L_{A,[k]} \right\} - \frac{1}{2} \max_{\hat{x} \in \Im \cap X_{k,-1}} \left\{ \frac{1}{\sigma^2} \|y - H \cdot \hat{s}\|^2 + \hat{x}_{[k]}^T \cdot L_{A,[k]} \right\}, \quad (27)$$

which approximates a solution to equation (12) above, and provides a probability value used to identify a bit being decoded.

The list $\Im$ provides the soft information about any given bit $x_k$ because if there are many entries in $\Im$ with $x_k=1$ then it can be concluded that the likely value of $x_k$ is 1 but if there are few entries in $\Im$ with $x_k=1$ then it can be concluded that the likely value of $x_k$ is $-1$. If there are no entries in $\Im$ with $x_k=1$ then the value of $L_E(x_k|y)$ can be set to an extreme value whose size can be made an increasing function of the radius r. A larger value of r generally allows for a larger size for the value $N_{cand}$, making the list more reliable. In practice, however, a simple clipping of L-values, for example to +50 or −50, also yields good results.

The choice of radius r in the performance of the process 200 of FIG. 2 is influenced by a need to find a number $N_{cand}$ of solution points sufficiently large to provide a solution to equation (27) that yields a sufficiently accurate value of $L_E(x_k|y)$. That is, the value of the radius r must be chosen so that equation (27) yields a sufficiently accurate approximation to equation (12). If r is chosen to be too small, the search volume will be too small and an inadequate number of solution points will be found. If the value of r is too small but the value of $N_{cand}$ is properly chosen, fewer than $N_{cand}$ solution points will be found. On the other hand, if the value of r is too large, the search space will be excessively large and the search will be slow because the search will be made over too many candidates before the $N_{cand}$ best candidates are found.

A reasonable value of r can be chosen by noting that for the true s, $$\|y - Hs\|^2 = \|n\|^2 \approx \sigma^2$$

$$\chi^2_{2N},$$

where $$\chi^2_{2N}$$

is a chi-square random variable with 2N degrees of freedom. The expected value of this random variable is $\sigma^2 E_{\chi_{2N}^2} = 2\sigma^2 N$. Therefore, given equation (25), one possible choice of radius is provided by $$r^2 = 2\sigma^2 KN - y^*(I - H(H^*H)^{-1}H^*)y, \quad (28)$$

where $K \geq 1$ is chosen to provide reasonable certainty, as measured by a confidence interval for the $$\chi^2_{2N}$$

random variable, that the true s will be captured. Depending on the size of $N_{cand}$, it is possible to increase the value of r by some multiple of the covering radius of the lattice, or by an approximation of the covering radius. In such cases, the extent of the required increase can be determined by trial and error.

Figure 7:
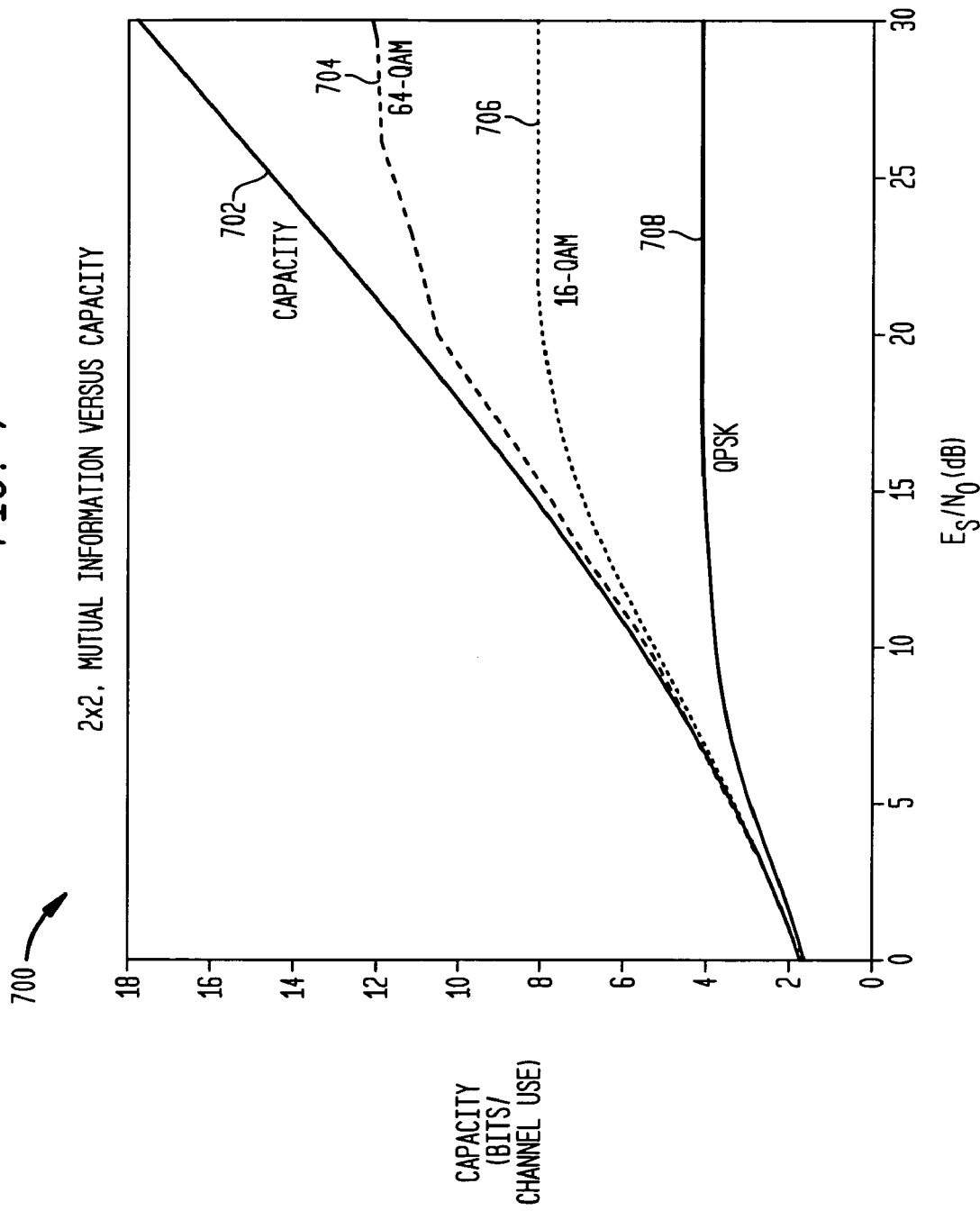
FIG. 7 is a graph illustrating ideal performance of various encoding and decoding systems.

FIG. 7 illustrates ideal performance of detection and decoding of transmissions using exemplary constellations over an exemplary channel. FIGS. 8A–8D, 9A–9B and 10 illustrate experimental results obtained by the use of detection and decoding processes according to the teachings of the present invention, for transmissions using particular exemplary constellations over exemplary channels.

With direct transmission, and assuming that the entries of the complex matrix H are independent complex Gaussian random variables having Rayleigh amplitude and uniform phase, with unit variance, the channel capacity of the model defined by equation (1) is $$C = E \log \det\left(I_N + \frac{\rho}{M} HH^*\right), \quad (29)$$

where $$\rho = \frac{E_s}{2\sigma^2}$$

is the signal to noise ratio as physically measured at each receive antenna, and the expectation is over the entries of H. It is convenient to use the convention that $$\frac{N_0}{2} = \sigma^2$$

defines the signal to noise ratio measure $$\rho = \frac{E_s}{N_0}.$$

For equation (29) to be meaningful, the channel should be ergodic in the sense that the statistical nature of H is observed as the channel is used. It is assumed that the channel is perfectly tracked by the receiver and interleaved so that successive channel uses see independent samples of H.

To achieve any point on the capacity curve of a particular channel, a symbol constellation with a Gaussian distribution is generally needed. Examples of such constellations are PSK or QAM constellations. To see the effect of a PSK or QAM constellation on the maximum achievable rate in the model defined by equation (1), it is convenient to compute the mutual information between the output y and input s, assuming that $s_1, \ldots s_M$ are chosen independently and are equally likely from the constellation.

As an example, FIG. 7 illustrates a graph 700, showing the maximum data rates that can be achieved with various constellations for two transmit and two receive antennas. The capacity is represented by the uppermost curve 702, which represents a Gaussian input. The mutual informations attained by various symbol constellations are shown in the remaining curves 704–708, with the curve 704 illustrating the information for a 64-QAM constellation, the curve 706 illustrating the information for a 16-QAM constellation and the curve 708 illustrating the information for a QPSK constellation.

To construct a system employing a particular transmission channel, it is desirable to achieve a point on the capacity curve for the channel, for example the curve 702, at some rate C. To achieve capacity at a data rate C, the vector constellation size must be $2^{MM_C}$ and the channel code rate R must be chosen such that such that $RMM_C=C$. In addition, a constellation must be chosen such that the mutual information attained by the constellation is close to the capacity curve at C. For example, suppose it is desired to achieve a rate of C=6 at $$\frac{E_s}{N_0} \approx 11 \text{ dB}.$$

One possibility is to choose a 64-QAM constellation, which has an uncoded maximum data rate of 12 bits per channel use and a channel code rate R=½. It can be seen by comparing the curves 602 and 604 of FIG. 7 that the mutual information of a 64-QAM constellation at 6 bits per channel is very close to capacity.

In order to understand the performance of the various exemplary systems illustrated in FIGS. 7, 8A–8D, 9A–9B and 10, it is useful to provide a definition of $$\frac{E_b}{N_0}.$$

The average signal energy per transmitted QAM constellation symbol is $$\frac{E_s}{M}.$$

Because fading coefficients are independent with unit variance, the average signal energy per receive antenna is $E_s$. Hence, N receive antennas collect total power N $E_s$, carrying $MM_C$ coded bits, or $RMM_C$ information bits. The signal energy per transmitted information bit at the receiver may therefore be defined as $$\frac{E_b}{N_0} = \frac{N}{RMM_C} \cdot E_s,$$

or, expressed in terms of logarithmic signal to noise ratio measures, $$\left.\frac{E_b}{N_0}\right|_{dB} = \left.\frac{E_s}{N_0}\right|_{dB} + 10\log_{10}\frac{N}{RMM_c} \qquad (30)$$

In the examples illustrated in FIGS. 8A–8D, 9A–8B and 10, the same number of transmit and receive antennas is employed, so that M=N. Direct transmission is employed with no special space-time mapping. The sphere detector operates very rapidly because it has as many equations as unknowns. For these simulations, a rate R=½ parallel concatenated, or turbo code of memory 2 with recursive feedback polynomial $G_r(D)=1+D+D^2$ and feedforward polynomial $G_r(D)=1+D^2$ is used. The interleaver size of the turbo code is 9216 information bits. As can be seen from FIG. 6, for a code rate of R=½ the constrained input capacity is generally very close to the continuous, or Gaussian, input capacity.

FIGS. 8A–8D illustrate graphs 800A–800D showing performance results for iterative detection and decoding for different modulation techniques for 1×1, 2×2, 4×4 and 8×8 MIMO channels, respectively. For $MM_C=8$ bits per vector channel symbol, full a posteriori probability detection was applied, so that a search was conducted over $2^{MM_C}$ hypotheses per detected bit. For $MM_C>8$, the list sphere detection process discussed above and illustrated in FIG. 6 was employed, with candidate lists of maximal lengths $N_{cand}=512$ for ($8<MM_C=32$) and $N_{cand}=1024$ for ($32<MM_C=48$). The respective capacity limits 802A–806A, 802B–806B, 802C–806C and 802D–806D indicate how closely the MIMO capacity is approached. The transmission is organized in blocks of length 9216 information bits. For each block, 4 iterations were performed over the MIMO detection loop, and 8 iterations within the turbo decoder. The curves 808A–812A illustrate the performance of a QPSK, 16-QAM and 64-QAM, respectively, for the 1×1 case, the curves 808B–812B, illustrate the performance of a QPSK, 16-QAM and 64-QAM, respectively, for the 2×2 case, the curves 808C–812C illustrate the performance of a QPSK, 16-QAM and 64-QAM, respectively, for the 4×4 case, and the curves 808D–812D illustrate the performance of a QPSK, 16-QAM and 64-QAM, respectively, for the 8×8 case.

Figure 8A:
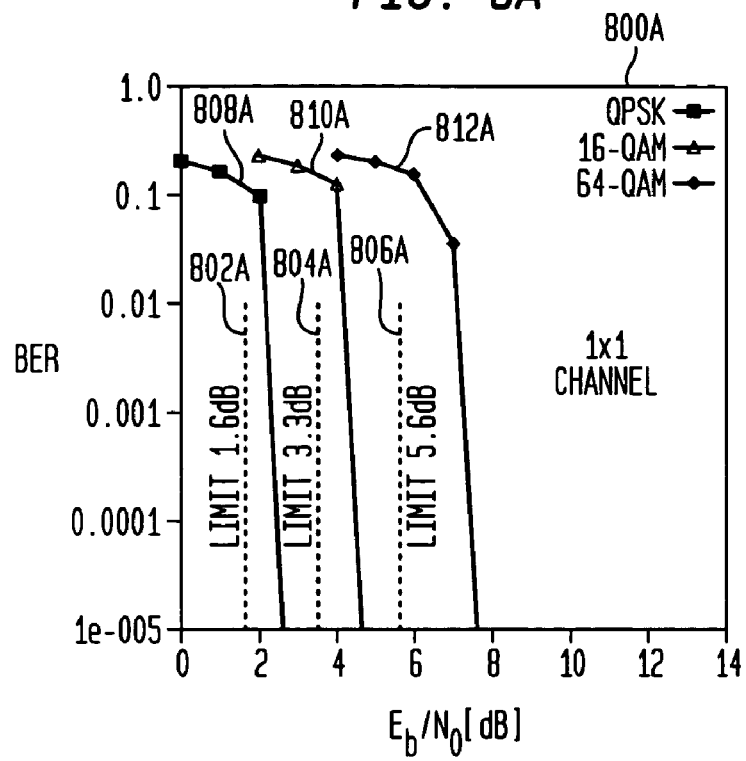
FIGS. 8A–8D illustrate the performance of selected encoding and decoding techniques according to the present invention.
Figure 8B:
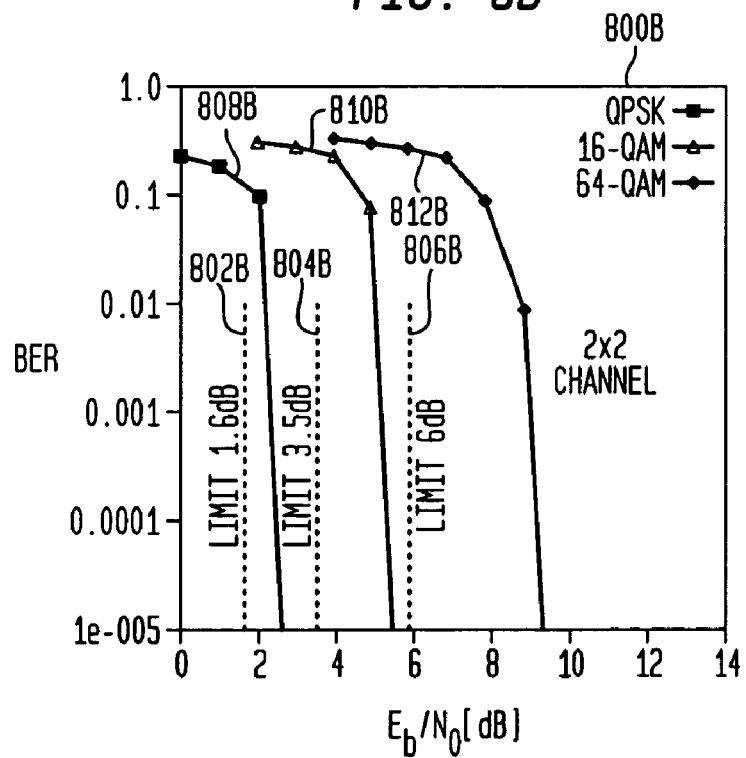
Figure 8C:
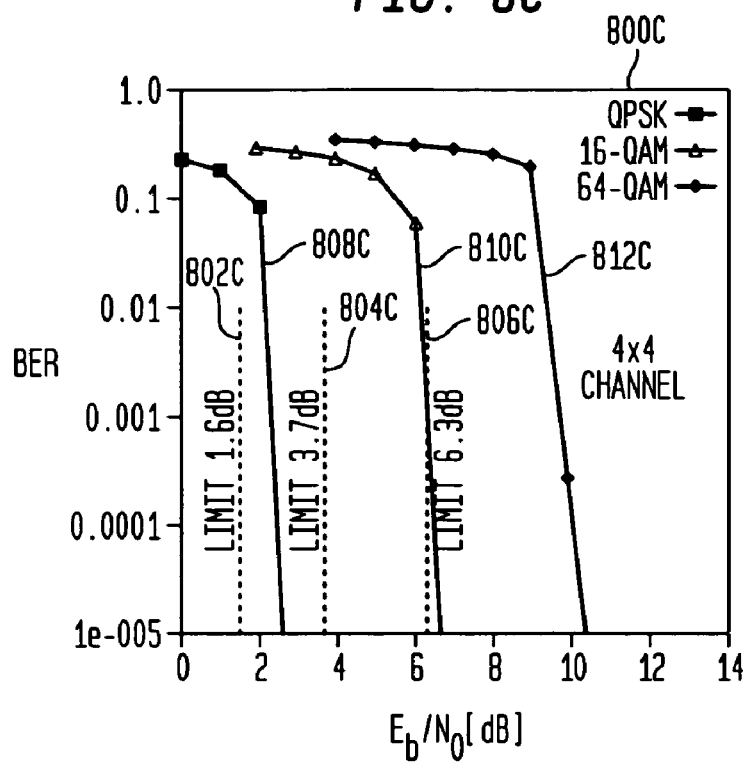
Figure 8D:
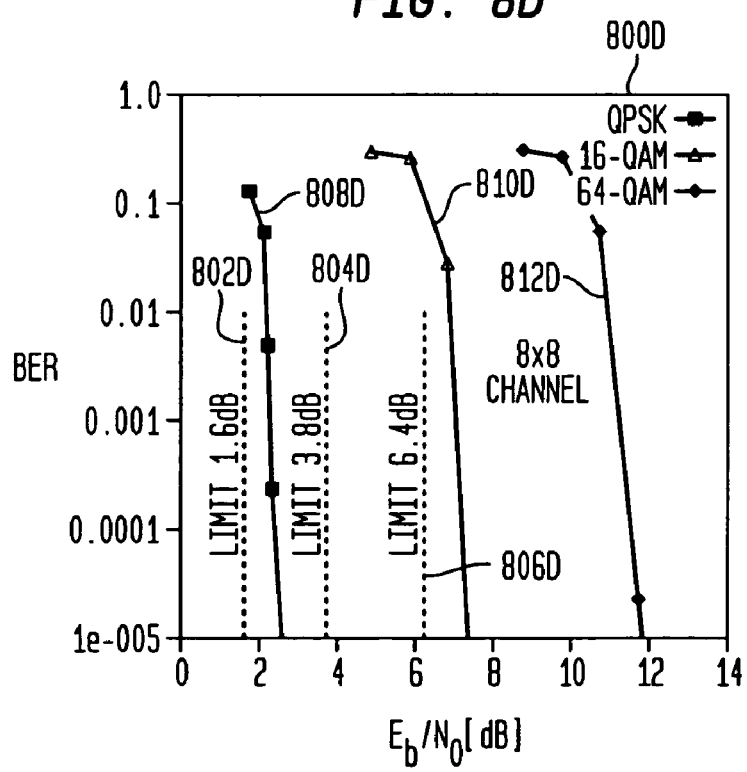

The BER curves for the 1×1 case illustrated in the graph 800A of FIG. 8A are given as references for turbo code performance on a Rayleigh channel. As a general rule, the more bits that are involved in the detection process $M \cdot M_C$, the more candidates should be kept for computing the soft output values. Hence, the process of limiting the candidate list to a reasonable number is especially restrictive for the 64-QAM, 8×8 case, that is, the curve 812D of FIG. 8D, where $MM_C=48$. Most of the gap of approximately 6 dB from the capacity limit is due to the setting of $N_{cand}=1024$, which is a tiny fraction of $2^{M \cdot M_C} \approx 2.81 \cdot 10^{14}$, the number of hypotheses required for full APP detection. Even this small list of $N_{cand}=1024$ candidates is very helpful, and note that reducing this list to $N_{cand}=1$, where the sole candidate was the maximum likelihood estimate, would result in a BER curve (not shown) at about 17 dB (not shown), representing an additional loss of 5 dB.

Figure 9A:
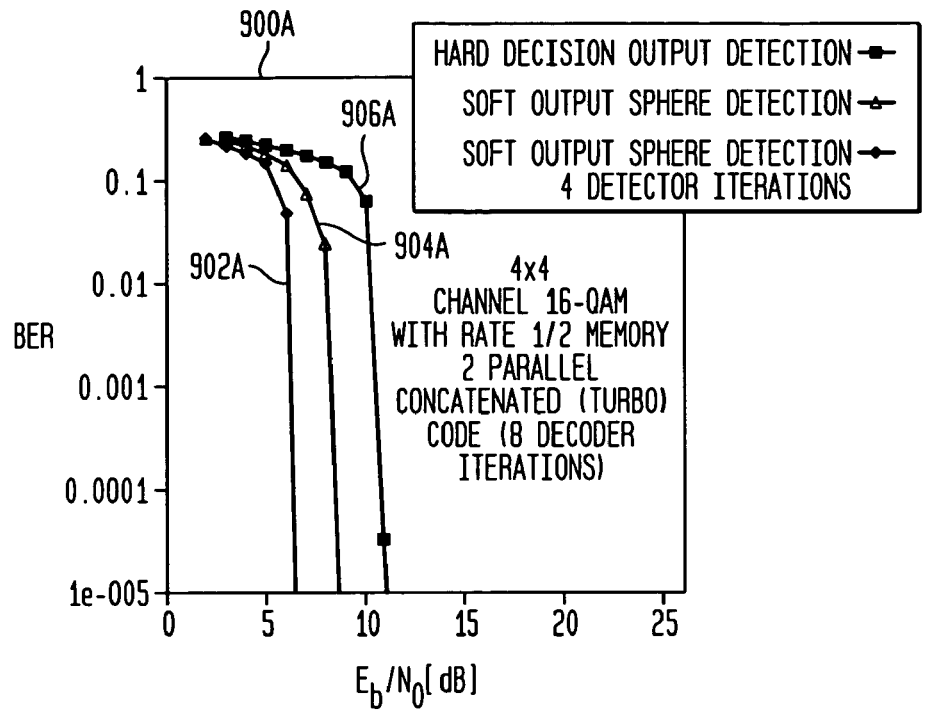
FIGS. 9A and 9B illustrate the performance of additional encoding and decoding techniques according to the present invention.
Figure 9B:
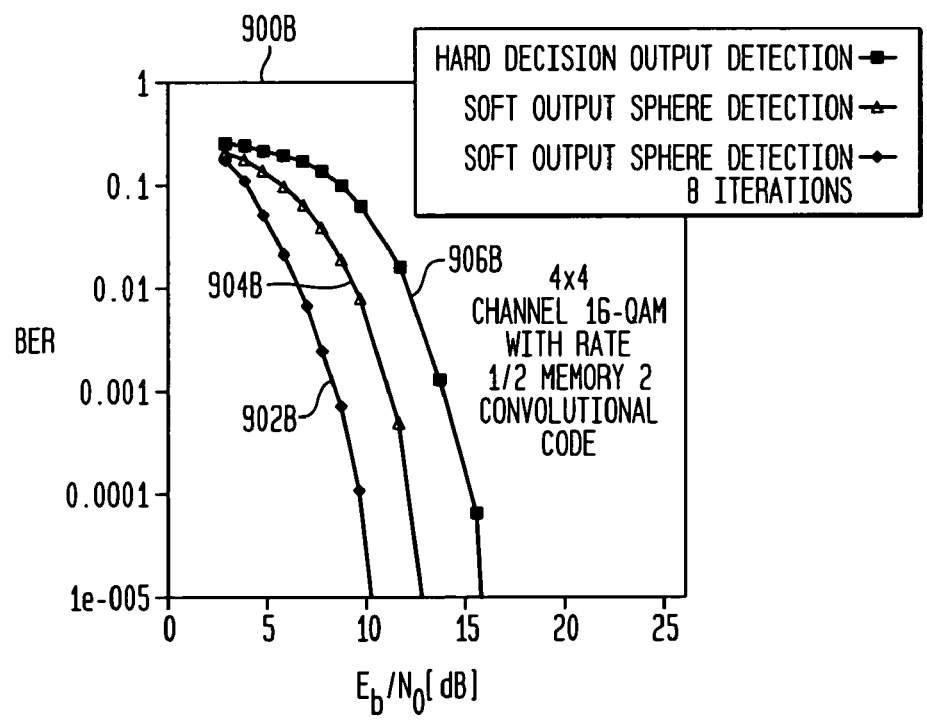

FIGS. 9A and 9B compare the performance of iterative detection and decoding using a very simple outer convolutional code with the turbo code. FIG. 9A illustrates a graph 900A showing detection and decoding performance for a 4×4 channel using a rate ½ memory 2 parallel concatenated, or turbo, code, using a 16-QAM constellation. The graph 900A includes curves 902A–906A, illustrating the performance of maximum likelihood detection, list sphere detection with one iteration, and list sphere detection with four detector iterations, respectively. FIG. 9B illustrates a graph 900B showing detection and decoding performance for a 4×4 channel employing a rate ½ memory 2 convolutional code with a 16-QAM constellation. The graph 900B includes curves 902B–906B, illustrating the performance of maximum likelihood detection, list sphere detection with one iteration and list sphere detection with 9 detector iterations. Although the final performance of the turbo code illustrated in FIG. 9A is better, the advantage is only approximately 4 dB, It can also be seen that the gains from increasing the detector/decoder iterations are more pronounced using the convolutional code of FIG. 9B.

FIG. 10 illustrates a graph 1000, showing performance of a rate=¾ memory 2 turbo code, yielding a spectral efficiency of $RMM_C=36$ bits per channel use, that is, 64-QAM on an 8×8 channel. The graph 1000 includes the curves 1002A–1002C, showing performance for maximum likelihood detertion list sphere detection with one iteration and list sphere detection with four iterations. It can be seen that while the performance of the maximum likelihood case illustrated by the curve 1002A is good, the curve 1002C shows that the use of iterations with a candidate list of length $N_{cand}=512$ gains another 3 dB and achieves a performance of less than 5 dB below capacity.

While the present invention is disclosed in the context of various aspects of presently preferred embodiments, it will be recognized that a wide variety of implementations may be employed by persons of ordinary skill in the art consistent with the above discussion and the claims which follow below.

We claim:

1. A system for transmitting and receiving data, comprising:
   a transmitter for transmitting signals representing encoded symbols, the encoded symbols being drawn from a constellation of symbols and representing an encoded bitstream comprising an original bitstream subjected to outer encoding; and
   a receiver for receiving and decoding the transmitted signals, the receiver being operative to employ list sphere decoding to create a list of candidate symbols found within the smallest radii in the constellation of symbols, the receiver being operative to use the list of candidate symbols to create inner extrinsic information indicating identities of bits in the encoded bitstream represented by the encoded symbols, the inner extrinsic information also including reliability information relating to the probability of correctness of the indications of the identities of the bits.

2. The system of claim 1, wherein the receiver is operative to employ inner a priori information to improve the accuracy of the inner extrinsic information and wherein the receiver is further operative to employ the inner extrinsic information to compute outer a priori information used to compute the original bitstream represented by the encoded bitstream, the outer a priori information being further employed to create outer extrinsic information used to compute the inner a priori information and wherein the inner a priori information and the outer extrinsic information, and the outer extrinsic information and the inner a priori information are exchanged over a series of iterations in order to improve the accuracy of the computation of the encoded bitstream represented by the encoded symbols and the original bitstream represented by the encoded bitstream.

3. The system of claim 2, wherein the inner a priori information and the outer extrinsic information, and the outer extrinsic information and the inner a priori information are exchanged over a predetermined number of iterations.

4. The system of claim 3, wherein the inner a priori information and the outer extrinsic information, and the outer extrinsic information and the inner a priori information are exchanged over a series of iterations continuing until a desired level of accuracy of computation of the encoded bitstream and the original bitstream are achieved.

5. The system of claim 2, wherein the inner a priori information and the outer extrinsic information, and the outer extrinsic information and the inner a priori information are exchanged over a series of iterations continuing until an increase in the accuracy of computation of the encoded bitstream and the original bitstream diminishes below a predetermined amount during an iteration.

6. The system of claim 2, wherein the encoded symbols are transmitted in the form of a channel code comprising a series of blocks of symbols and wherein the identities of the bits represented by each symbol are computed in light of all blocks of received symbols.

7. The system of claim 6, wherein the transmitter employs multiple transmit antennas and the receiver employs multiple receive antennas.

8. The system of claim 7, wherein the transmitter transmits at a rate near a capacity of a channel comprising the multiple transmit antennas and the multiple receive antennas and wherein the receiver receives and decodes symbols transmitted by the transmitter at the rate near the capacity of the channel.

9. The system of claim 8, wherein the list sphere decoding is adapted to processing of complex symbol constellations.

10. The system of claim 9, wherein a number of candidate solutions comprising the list of candidate symbols is established at a predetermined number.

11. A receiver for receiving and decoding encoded symbols, the encoded symbols being drawn from a symbol constellation and representing an encoded bitstream comprising an original bitstream subjected to outer encoding, comprising:
   a multiple-input multiple-output detector to compute inner extrinsic information indicating identities of bits in the encoded bitstream represented by the encoded symbols, the inner extrinsic information also including reliability information relating to the probability of correctness of the indications, the multiple-input multiple-output detector being operative to employ list sphere decoding to create a list of candidate symbols which are used to compute the inner extrinsic information; and a soft-input soft-output decoder to reconstruct the original bitstream represented by the encoded bitstream, the soft-input soft-output decoder being operative to compute outer extrinsic information identifying the identities of bits comprising the original bitstream, the outer extrinsic information being used to compute inner a priori information used as an input to the multiple-input multiple-output detector.

12. The receiver of claim 11, wherein the multiple-input multiple-output detector employs complex list sphere decoding to compute the inner extrinsic information.

13. The receiver of claim 12, wherein the detector and the decoder exchange inner extrinsic information and outer a priori information and outer extrinsic information and inner a priori information over a series of iterations in order to improve the accuracy of the identification of bits in the encoded bitstream and the reconstruction of the original bitstream.

14. A method of data communication, comprising the steps of:
encoding an original bitstream to produce an encoded bitstream including elements adding error correction and redundancy;
translating the encoded bitstream into symbols drawn from a symbol constellation;
transmitting the symbols over a communication channel;
receiving channel observations representing the symbols;
performing list sphere decoding on the channel observations to create a list of candidate symbols;
using the list of candidate symbols to compute inner extrinsic information used to indicate identities of bits comprising the encoded bitstream;
using the inner extrinsic information to compute outer a priori information used to create outer extrinsic information;
using the outer extrinsic information to identify bits in the original bitstream;
using the outer extrinsic information to create inner a priori information used to increase the accuracy of computation of the inner extrinsic information; and
exchanging the inner extrinsic information, the outer a priori information, the outer extrinsic information and the inner a priori information over a number of iterations to increase the accuracy of computation of the encoded bitstream and the original bitstream.

15. The method of claim 14, wherein the list of candidate symbols is used to perform computations maximizing variables indicating the values of the inner extrinsic information.

16. The method of claim 15 wherein the communication channel is a multiple-input multiple-output channel comprising a plurality of transmit antennas and a plurality of receive antennas.

17. The method of claim 16 wherein the symbols are transmitted in blocks of symbols and wherein the identities of bits comprising the encoded bitstream are computed in light of all received blocks of symbols.

18. A method of creating a list of solution points within a constellation of available symbols, for use in identifying an encoded bitstream represented by a channel observation vector, comprising the steps of:
(a) choosing a list size number representing a desired number of candidate solution points;
(b) choosing a search radius within which a search is to be conducted;
(c) creating a list of candidate solution points representing symbols conforming to the channel observation vector and having radii within the search radius, the list of candidate resolution points including all of the solution points found within the search radius up to the desired number;
(d) searching for additional solution points having a radius within the search radius;
(e) upon discovering a new solution point having a radius within the search radius, determining if the radius of the new solution point has a smaller radius than any of the solution points already on the list, discarding the new solution point if its radius is not smaller than that of the solution point in the list having the largest radius and replacing the solution point with the largest radius with the new solution point if the radius of the new solution point is smaller than that of the solution point in the list having the largest radius; and
(f) repeating steps (d) and (e) until all points within the search radius have been searched.

19. The method of claim 18, wherein the constellation of available symbols is a real constellation, the step of choosing the search radius comprises choosing the search radius adapted to search within a real search sphere and the steps of creating the list of candidate solution points and searching for the additional solution points comprise searching for solution points within the real search sphere.

20. The method of claim 19, wherein the constellation of available symbols is a complex constellation, the step of choosing the search radius comprises choosing the search radius adapted to search within a complex search sphere and the steps of creating the list of candidate solution points and searching for the additional solution points comprise searching for solution points within the complex search sphere.

* * * * *